US010972859B2

(12) United States Patent
Honma et al.

(10) Patent No.: US 10,972,859 B2
(45) Date of Patent: Apr. 6, 2021

(54) SIGNAL PROCESSING APPARATUS AND METHOD AS WELL AS PROGRAM

(71) Applicant: Sony Corporation, Tokyo (JP)

(72) Inventors: Hiroyuki Honma, Chiba (JP); Yuki Yamamoto, Tokyo (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 16/500,591

(22) PCT Filed: Mar. 30, 2018

(86) PCT No.: PCT/JP2018/013630
§ 371 (c)(1),
(2) Date: Oct. 3, 2019

(87) PCT Pub. No.: WO2018/190151
PCT Pub. Date: Oct. 18, 2018

(65) Prior Publication Data

US 2020/0068336 A1 Feb. 27, 2020

(30) Foreign Application Priority Data

Apr. 13, 2017 (JP) ................................ 2017-079446

(51) Int. Cl.
*H03G 5/00* (2006.01)
*H04S 7/00* (2006.01)
(Continued)

(52) U.S. Cl.
CPC ............... *H04S 7/307* (2013.01); *H04R 3/04* (2013.01); *H04R 5/04* (2013.01); *H04S 2400/11* (2013.01); *H04S 2420/11* (2013.01)

(58) Field of Classification Search
CPC ......... G10L 19/00; G10L 19/008; H04R 3/04; H04R 5/04; H04S 2400/11; H04S 2420/11; H04S 7/00; H04S 7/307
(Continued)

(56) References Cited

U.S. PATENT DOCUMENTS 5,757,927 A * 5/1998 Gerzon ..................... H04S 3/02 381/18
7,394,904 B2 * 7/2008 Bruno ....................... H04S 3/02 381/18
(Continued)

FOREIGN PATENT DOCUMENTS

CN 103888889 A 6/2014
WO WO 2011/117399 A1 9/2011
WO WO 2017/027308 A1 2/2017

OTHER PUBLICATIONS

International Search Report and English translation thereof dated Jun. 19, 2018 in connection with International Application No. PCT/JP2018/013630.
(Continued)

*Primary Examiner* — Khai N. Nguyen
(74) *Attorney, Agent, or Firm* — Wolf, Greenfield & Sacks, P.C.

(57) ABSTRACT

The present technology relates to a signal processing apparatus and method capable of reducing calculation loads, as well as a program.
A signal processing apparatus includes an ambisonic gain calculation unit configured to find, on the basis of spread information of an object, an ambisonic gain while the object is present at a predetermined position. The present technology is applicable to an encoder and a decoder.

8 Claims, 17 Drawing Sheets

(51) Int. Cl.
*H04R 3/04* (2006.01)
*H04R 5/04* (2006.01)

(58) Field of Classification Search
USPC ............................................................ 381/98
See application file for complete search history.

(56) References Cited

U.S. PATENT DOCUMENTS

| | | | | |
|---|---|---|---|---|
| 9,479,886 | B2 * | 10/2016 | Xiang | H04S 1/007 |
| 9,516,446 | B2 * | 12/2016 | Xiang | G10L 19/008 |
| 9,609,452 | B2 * | 3/2017 | Peters | G10L 19/008 |
| 9,681,220 | B2 * | 6/2017 | Delikaris-Manias | H04R 1/08 |
| 9,761,229 | B2 * | 9/2017 | Xiang | G10L 19/008 |
| 9,800,991 | B2 * | 10/2017 | Robinson | H04S 7/30 |
| 9,832,589 | B2 * | 11/2017 | Lee | G10L 19/008 |
| 9,870,778 | B2 * | 1/2018 | Peters | H04S 3/008 |
| 9,936,321 | B2 * | 4/2018 | Boehm | H04S 3/02 |
| 10,136,240 | B2 * | 11/2018 | De Burgh | H04S 3/008 |
| 10,225,676 | B2 * | 3/2019 | Lando | H04R 5/02 |
| 10,419,869 | B2 * | 9/2019 | Crum | H04S 3/008 |
| 2007/0160216 | A1 * | 7/2007 | Nicol | G10H 1/0091 381/17 |
| 2014/0023196 | A1 * | 1/2014 | Xiang | H04S 7/30 381/17 |
| 2014/0023197 | A1 * | 1/2014 | Xiang | G10L 19/008 381/17 |
| 2014/0025386 | A1 * | 1/2014 | Xiang | G10L 19/008 704/500 |
| 2014/0233917 | A1 * | 8/2014 | Xiang | H04S 7/30 386/285 |
| 2015/0264484 | A1 * | 9/2015 | Peters | G10L 19/008 381/17 |
| 2015/0304766 | A1 * | 10/2015 | Delikaris-Manias | G10L 21/0216 381/92 |
| 2015/0341736 | A1 * | 11/2015 | Peters | H04S 7/30 381/17 |
| 2016/0119737 | A1 * | 4/2016 | Mehnert | H04S 7/303 381/310 |
| 2016/0323688 | A1 * | 11/2016 | Lee | H04S 7/307 |
| 2017/0011751 | A1 * | 1/2017 | Fueg | H04S 7/00 |
| 2017/0171682 | A1 * | 6/2017 | Boehm | H04S 3/008 |
| 2017/0200452 | A1 * | 7/2017 | Peters | H04S 3/02 |
| 2017/0215020 | A1 * | 7/2017 | Robinson | H04R 5/02 |
| 2017/0374484 | A1 * | 12/2017 | Lando | H04S 3/008 |
| 2018/0115850 | A1 * | 4/2018 | De Burgh | H04S 3/008 |
| 2018/0139566 | A1 * | 5/2018 | Crum | H04S 7/304 |
| 2018/0192222 | A1 * | 7/2018 | De Bruijn | H04N 13/398 |
| 2019/0222798 | A1 * | 7/2019 | Honma | G06K 9/0057 |
| 2020/0068336 | A1 * | 2/2020 | Honma | H04S 7/307 |
| 2020/0275233 | A1 * | 8/2020 | Mason | H04R 5/04 |

OTHER PUBLICATIONS

[No Author Listed], International Standard ISO/IEC 23008-3. Information technology—High efficiency coding and media delivery in heterogeneous environments—Part 3: 3D audio. Feb. 1, 2016. 439 pages.

Bleidt et al., Development of the MPEG-H TV Audio System for ATSC 3.0. IEEE Transactions on Broadcasting, 2017;63(1):202-236.

Herre et al., MPEG-H 3D Audio—The new Standard for Coding of Immersive Spatial Audio, IEEE Journal of Selected Topics in Signal Processing, 2015;9(5):770-779.

International Written Opinion and English translation thereof dated Jun. 19, 2018 in connection with International Application No. PCT/JP2018/013630.

International Preliminary Report on Patentability and English translation thereof dated Oct. 24, 2019 in connection with International Application No. PCT/JP2018/013630.

Extended European Search Report dated Feb. 7, 2020 in connection with European Application No. 18784930.2.

* cited by examiner

FIG. 1

| Syntax | No. of bits | Mnemonic |
|---|---|---|
| object_metadata() | | |
| { | | |
| for ( i=0; i < num_objects; i++) { | | |
| object_priority[i]; | 3 | uimsbf |
| spread[i]; | 8 | tcimsbf |
| position_azimuth[i]; | 8 | tcimsbf |
| position_elevation[i]; | 6 | tcimsbf |
| position_radius[i]; | 4 | uimsbf |
| gain_factor[i]; | 7 | tcimsbf |
| } | | |
| } | | |

FIG. 9

| Syntax | No. of bits | Mnemonic |
|---|---|---|
| object_metadata() | | |
| { | | |
| for ( i=0; i < num_objects; i++) { | | |
| object_priority[i]; | 3 | uimsbf |
| spread_width[i]; | 8 | tcimsbf |
| spread_height[i]; | 6 | tcimsbf |
| position_azimuth[i]; | 8 | tcimsbf |
| position_elevation[i]; | 6 | tcimsbf |
| position_radius[i]; | 4 | uimsbf |
| gain_factor[i]; | 7 | tcimsbf |
| } | | |
| } | | |

SIGNAL PROCESSING APPARATUS AND METHOD AS WELL AS PROGRAM

CROSS-REFERENCE TO RELATED APPLICATIONS

This application claims the benefit under 35 U.S.C. § 371 as a U.S. National Stage Entry of International Application No. PCT/JP2018/013630, filed in the Japanese Patent Office as a Receiving Office on Mar. 30, 2018, which claims priority to Japanese Patent Application Number JP2017-079446, filed in the Japanese Patent Office on Apr. 13, 2017, each of which is hereby incorporated by reference in its entirety.

TECHNICAL FIELD

The present technology relates to a signal processing apparatus and method as well as a program, and particularly to a signal processing apparatus and method capable of reducing calculation loads, as well as a program.

BACKGROUND ART

An object audio technology has already been used for movies, games, or the like, and encoding systems capable of handling object audio have been developed. Specifically, there has been known the moving picture experts group (MPEG)-H Part 3:3D audio standard or the like as an international standard, for example (see Non-Patent Document 1, for example).

A moving sound source or the like can be handled as an independent audio object, and signal data of an audio object and position information of an object can be encoded as metadata in such encoding systems, as in a multichannel sound system such as the conventional 2-channel sound system. or 5.1-channel sound system.

By doing so, the sound of a specific sound source can be easily processed at the time of reproduction, such as sound volume adjustment of a specific sound source which is difficult in the conventional encoding systems or addition of an effect to the sound of a specific sound source.

Further, in the encoding system described in Non-Patent Document 1, ambisonic (also called high order ambisonic (HOA)) data which handles spatial acoustic information around a viewer can be handled in addition to the above audio object.

Incidentally, the audio object is assumed to be of a point sound source when being rendered to a speaker signal, a headphone signal, or the like, and thus the audio object in a size cannot be expressed.

Thus, in the encoding system capable of handling object audio such as the encoding system described in Non-Patent Document 1, information called spread, which expresses the size of an object is stored in metadata of an audio object.

Then, in the standard of Non-Patent Document 1, for example, 19 spread audio object signals are newly generated for one audio object on the basis of a spread, and rendered and output to a reproduction apparatus such as a speaker, at the time of reproduction. Thereby, an audio object in a pseudo size can be expressed.

CITATION LIST

Non-Patent Document

Non-Patent Document 1: INTERNATIONAL STANDARD ISO/IEC 23008-3 First edition 2015-10-15 Information technology—High efficiency coding and media delivery in heterogeneous environments—Part 3:3D audio

SUMMARY OF THE INVENTION

Problems to be Solved by the Invention

However, 19 spread audio object signals are newly generated for one audio object as described above, which leads to a remarkable increase in calculation loads in the rendering processing.

The present technology has been made in terms of such a situation, and is directed for reducing calculation loads.

Solutions to Problems

A signal processing apparatus according to an aspect of the present technology includes an ambisonic gain calculation unit configured to find, on the basis of spread information of an object, an ambisonic gain while the object is present at a predetermined position.

The signal processing apparatus can be further provided with an ambisonic signal generation unit configured to generate an ambisonic signal of the object on the basis of an audio object signal of the object and the ambisonic gain.

The ambisonic gain calculation unit can find a reference position ambisonic gain, on the basis of the spread information, assuming that the object is present at a reference position, and can perform rotation processing on the reference position ambisonic gain to find the ambisonic gain on the basis of object position information indicating the predetermined position.

The ambisonic gain calculation unit can find the reference position ambisonic gain on the basis of the spread information and a gain table.

The gain table can be configured such that a spread angle is associated with the reference position ambisonic gain.

The ambisonic gain calculation unit can perform interpolation processing on the basis of each reference position ambisonic gain associated with each of a plurality of the spread angles in the gain table to find the reference position ambisonic gain corresponding to a spread angle indicated by the spread information.

The reference position ambisonic gain can be assumed as a sum of respective values obtained by substituting respective angles indicating a plurality of respective spatial positions defined for spread angles indicated by the spread information into a spherical harmonic function.

A signal processing method or a program according to an aspect of the present technology includes a step of finding, on the basis of spread information of an object, an ambisonic gain while the object is present at a predetermined position.

According to an aspect of the present technology, an ambisonic gain while the object is present at a predetermined position can be found on the basis of spread information of an object.

Effects of the Invention

According to an aspect of the present technology, it is possible to reduce calculation loads.

Additionally, the effect described herein is not necessarily limited, and may be any effect described in the present disclosure.

BRIEF DESCRIPTION OF DRAWINGS

FIG. 1 is a diagram for explaining metadata of an audio object.

FIG. 9 is a diagram for explaining metadata of an audio object.

MODE FOR CARRYING OUT THE INVENTION

Embodiments according to the present technology will be described below with reference to the drawings.

First Embodiment

<Present Technology>

The present technology is directed for directly finding an ambisonic gain on the basis of spread information, and obtaining an ambisonic signal from the resultant ambisonic gain and an audio object signal, thereby reducing calculation loads.

Spread of an audio object in the MPEG-H Part 3:3D audio standard (also denoted as spread information below) will be first described.

FIG. 1 is a diagram illustrating an exemplary format of metadata of an audio object including spread information.

The metadata of the audio objet is encoded by use of the format illustrated in FIG. 1 per predetermined time interval.

In FIG. 1, num_objects indicates the number of audio objects included in a bit stream. Further, tcimsbf stands for Two's complement integer, most significant bit first, and uimsbf stands for Unsigned integer, most significant bit first.

Figure 2:
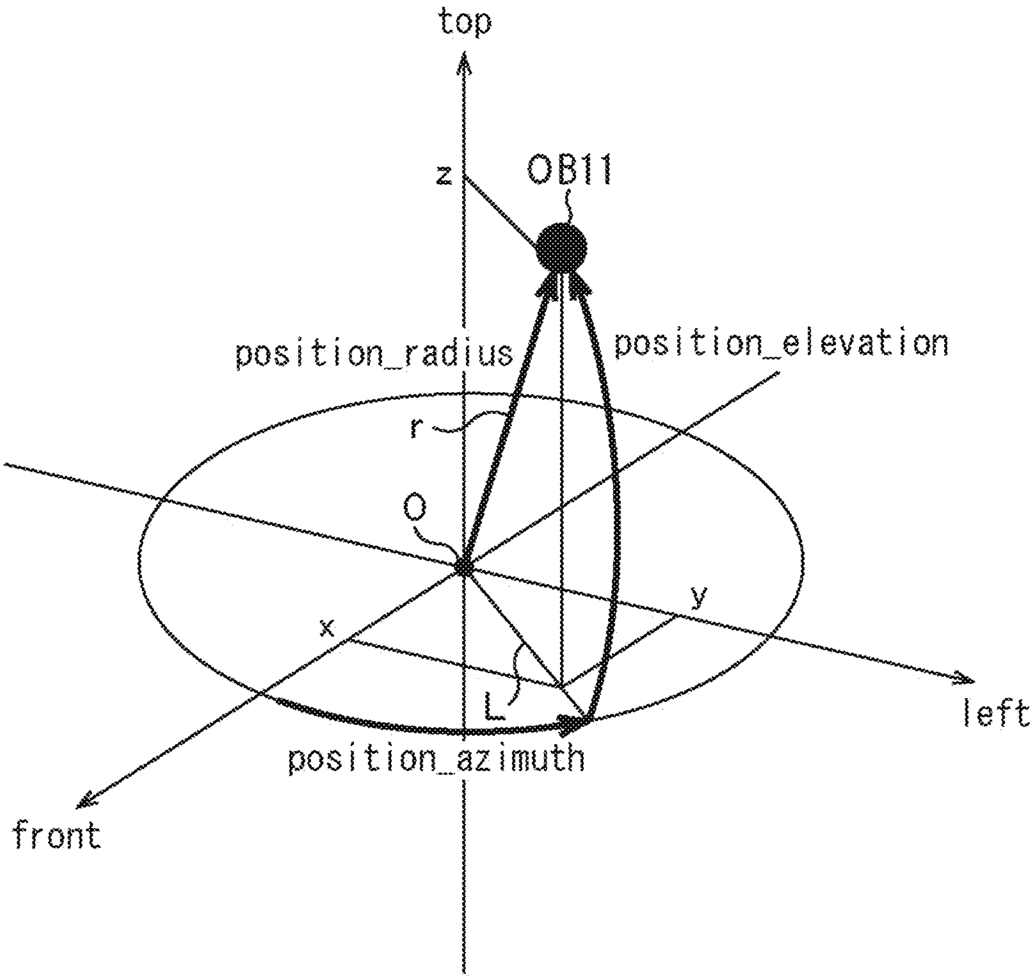
FIG. 2 is a diagram for explaining a 3D spatial position of an audio object.

In this example, the metadata stores object_priority, spread, position_azimuth, position_elevation, position_radius, and gain_factor per audio object.

object_priority is priority information indicating the priority when the audio object is rendered in a reproduction apparatus such as a speaker. For example, in a case where audio data is reproduced in a device with less calculation resources, an audio object signal with high object_priority can be preferentially reproduced.

spread is metadata (spread information) indicating the size of the audio object, and is defined as an angle indicating a spread from the spatial position of the audio object in the MPEG-H Part 3:3D audio standard. gain_factor is gain information indicating the gain of an individual audio object.

position_azimuth, position_elevation, and position_radius indicate an azimuth angle, an elevation angle, and a radius (distance) indicating the spatial position information of the audio object, respectively, and a relationship among the azimuth angle, the elevation angle, and the radius is as illustrated in FIG. 2, for example.

That is, the x-axis, the y-axis, and the z-axis, which pass through the origin O and are perpendicular to each other in FIG. 2, are the axes in the 3D orthogonal coordinate system.

Now assume a straight line connecting the origin O and the position of an audio object OB11 on the space as a straight line r, and a straight line obtained by projecting the straight line r onto the xy plane as a straight line L.

At this time, an angle formed by the x-axis and the straight line L is assumed as an azimuth angle indicating the position of the audio object OB11, or position_azimuth, and an angle formed by the straight line r and the xy plane is assumed as an elevation angle indicating the position of the audio object OB11, or position_elevation. Further, the length of the straight line r is assumed as a radius indicating the position of the audio object OB11, or position_radius.

Returning to the description of FIG. 1, object_priority, spread, position_azimuth, position_elevation, position_radius, and gain_factor illustrated in FIG. 1 are read on the decoding side, and are used as needed.

A method for rendering an audio object with spread (spread information) in a reproduction apparatus such as a speaker in the MPEG-H Part 3:3D audio standard will be described below.

For example, in a case where a normal audio object with no spread, in other words, with an angle of 0 degree indicated by spread is rendered, a method called vector base amplitude panning (VBAP) is used.

Additionally, VBAP is described in "INTERNATIONAL STANDARD ISO/IEC 23008-3 First edition 2015-10-15 Information technology—High efficiency coding and media delivery in heterogeneous environments—Part 3:3D audio" or the like, for example, and the description thereof will be omitted.

To the contrary, in a case where spread of the audio object is present, vector $p_0$ to vector $p_{18}$ indicating the positions of 19 spread audio objects are found on the basis of spread.

That is, a vector indicating a position indicated by metadata of an audio object to be processed is assumed as basic vector $p_0$. Further, the angles indicated by position_azimuth and position_elevation of the audio object to be processed are assumed as angle $\phi$ and angle $\theta$, respectively. At this time, a basic vector v and a basic vector u are found in the following Equations (1) and (2), respectively.

[Math. 1]

$$v = \begin{cases} \mathrm{cart}(\phi, \theta + 90°, 1) & \theta < 0° \\ \mathrm{cart}(\phi, \theta - 90°, 1) & \theta \geq 0° \end{cases} \tag{1}$$

[Math. 2]

$$u = v \times p_0 \tag{2}$$

Note that "x" in Equation (2) indicates cross product.

Subsequently, 18 vectors $p_1'$ to $p_{18}'$ are found in the following Equation (3) on the basis of the two basic vectors v and u, and the vector $p_0$.

[Math. 3]

$$\begin{aligned} p'_1 &= u \\ p'_2 &= 0.75\,u + 0.25\,p_0 \\ p'_3 &= 0.375\,u + 0.625\,p_0 \\ p'_4 &= -u \\ p'_5 &= -0.75\,u + 0.25\,p_0 \\ p'_6 &= -0.375\,u + 0.625\,p_0 \\ p'_7 &= 0.5\,u + 0.866\,v + \frac{p_0}{3} \\ p'_8 &= 0.5\,p'_7 + 0.5\,p_0 \\ p'_9 &= 0.25\,p'_7 + 0.75 \\ p'_{10} &= -0.5\,u + 0.866\,v + \frac{p_0}{3} \\ p'_{11} &= 0.5\,p'_{10} + 0.5\,p_0 \\ p'_{12} &= 0.25\,p'_{10} + 0.75\,p_0 \\ p'_{13} &= -0.5\,u - 0.866\,v + \frac{p_0}{3} \\ p'_{14} &= 0.5\,p'_{13} + 0.5\,p_0 \\ p'_{15} &= 0.25\,p'_{13} + 0.75\,p_0 \\ p'_{16} &= 0.5\,u - 0.866\,v + \frac{p_0}{3} \\ p'_{17} &= 0.5\,p'_{16} + 0.5\,p_0 \\ p'_{18} &= 0.25\,p'_{16} + 0.75 \end{aligned} \tag{3}$$

Figure 3:
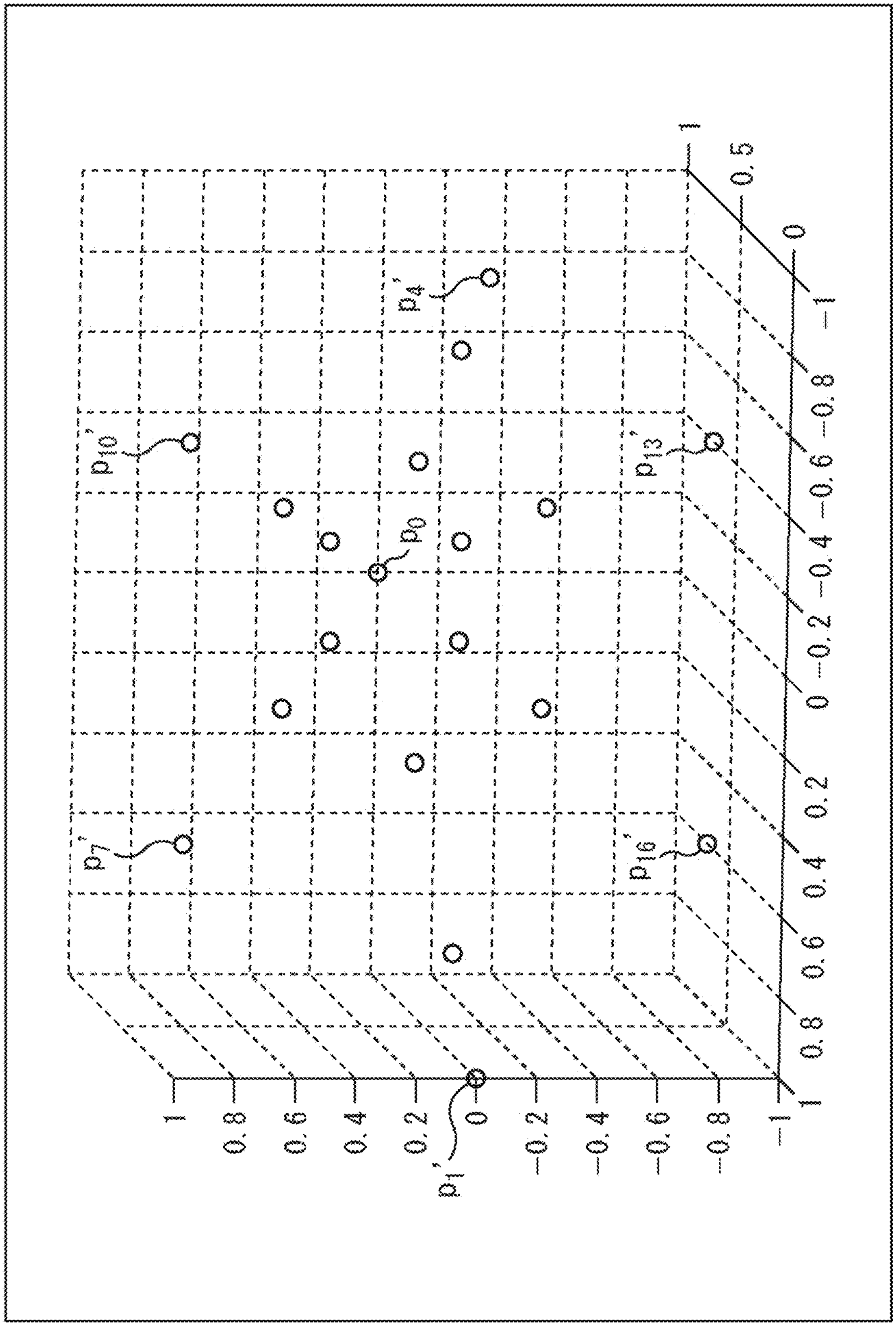
FIG. 3 is a diagram for explaining spread audio objects.

When the positions indicated by the 18 vectors $p_1'$ to $p_{18}'$ obtained in Equation (3) and the vector $p_0$, respectively, are plotted on the 3D orthogonal coordinate system, FIG. 3 is obtained. Additionally, one circle indicates a position indicated by one vector in FIG. 3.

Here, assuming an angle α indicated by spread of the audio object, and the angle α limited between 0.001 degrees and 90 degrees as α', the 19 vectors $p_m$ (where m=0, 1, . . . , 18) modified by spread are as indicated in the following Equation (4).

[Math. 4]

$$p_m = p'_m + \frac{p_0}{\tan(\alpha')} \tag{4}$$

The thus-obtained vector $p_m$ is normalized, and thus the 19 spread audio objects corresponding to spread (spread information) are generated. Here, one spread audio object is a virtual object at a spatial position indicated by one vector $p_m$.

The signals of the 19 spread audio objects are rendered in a reproduction apparatus such as a speaker, and thus the sound of one audio object with a spatial spread corresponding to spread can be output.

Figure 4:
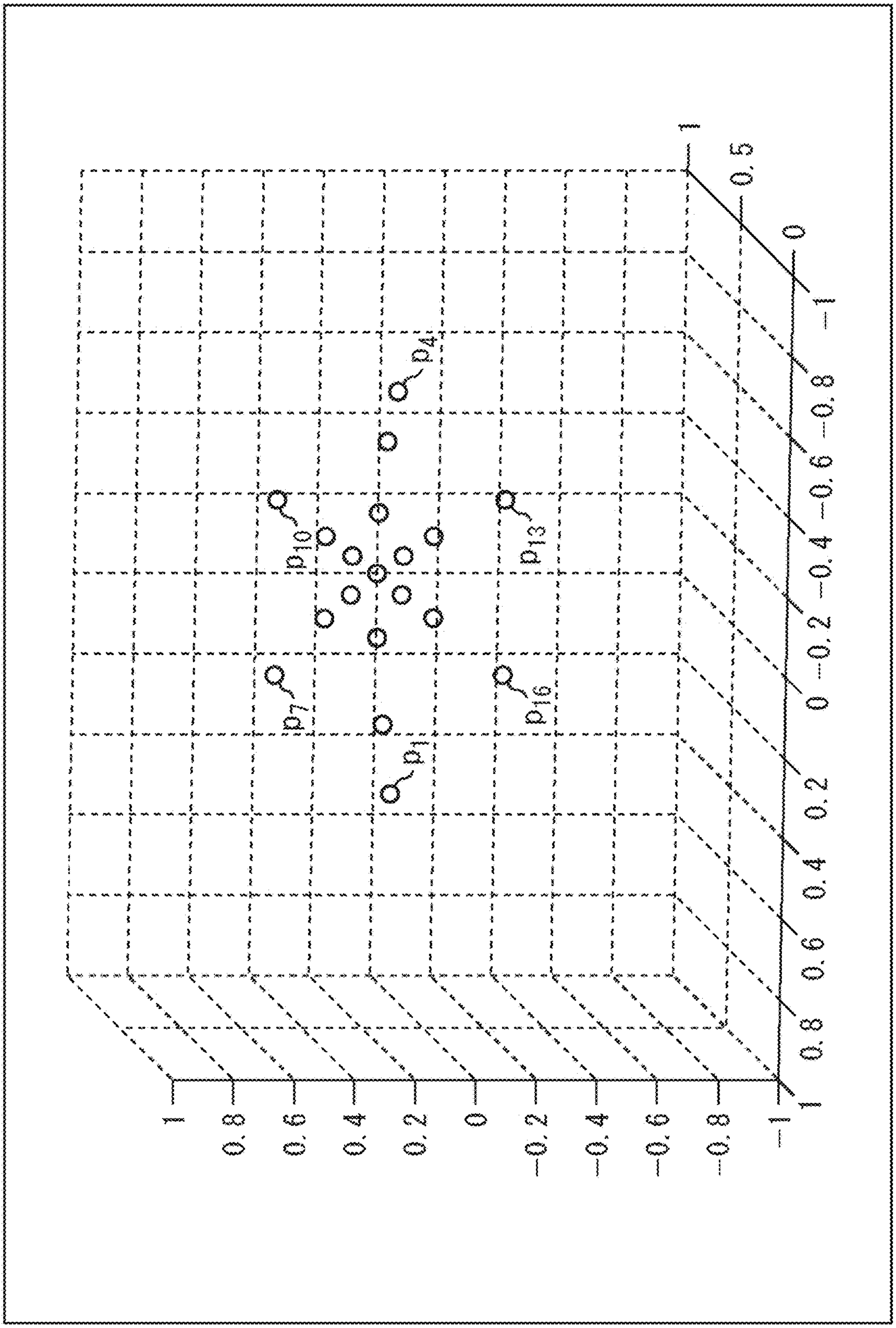
FIG. 4 is a diagram for explaining spread audio objects.

FIG. 4 is a diagram illustrating 19 spread audio objects plotted onto the 3D orthogonal coordinate system in a case where the angle indicated by spread is 30 degrees. Further, FIG. 5 is a diagram illustrating 19 spread audio objects plotted onto the 3D orthogonal coordinate system in a case where the angle indicated by spread is 90 degrees.

Figure 5:
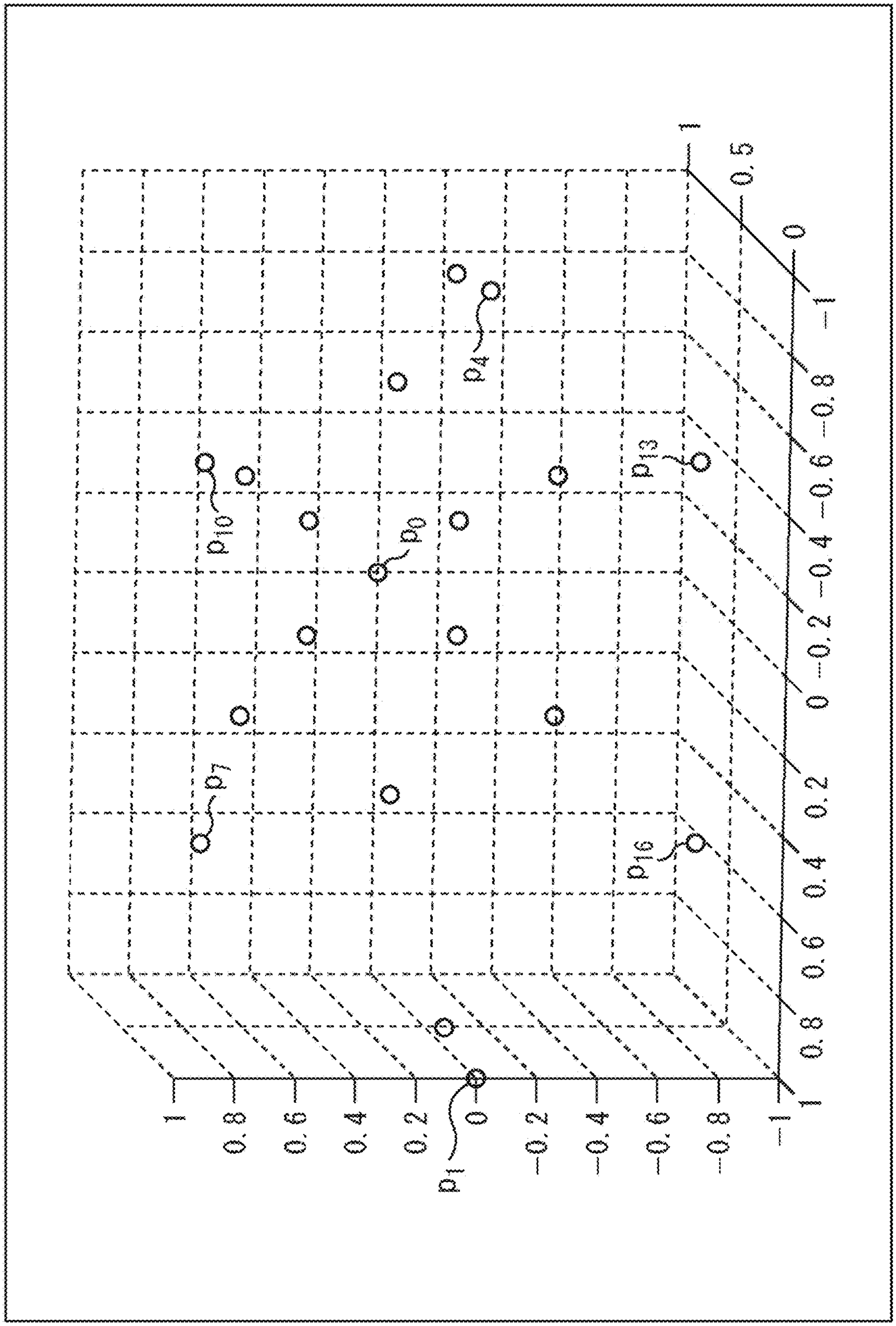
FIG. 5 is a diagram for explaining spread audio objects.

One circle indicates a position indicated by one vector in FIG. 4 and FIG. 5. That is, one circle indicates one spread audio object.

When a signal of an audio objet is reproduced, an audio signal containing signals of the 19 spread audio objects is reproduced as a signal of one audio object, and thus the audio object in a size is expressed.

Further, in a case where the angle indicated by spread exceeds 90 degrees, λ indicated in the following Equation (5) is assumed as a distribution ratio, and a rendering result when the angle indicated by spread is assumed as 90 degrees and an output result when all the speakers are at constant gain are combined and output at the distribution ratio λ.

[Math. 5]

$$\lambda = \frac{\alpha - 90^\circ}{90^\circ} \tag{5}$$

As described above, the 19 spread audio objects are generated on the basis of spread (spread information) when a signal of an audio object is reproduced, and the audio object in a pseudo size is expressed.

However, 19 spread audio objects are generated for one audio object, which leads to a remarkable increase in calculation loads of the rendering processing.

Thus, according to the present technology, an ambisonic gain based on spread information is directly found without generating 19 spread audio objects for one audio object with the spread information during rendering, thereby reducing calculation loads.

The present technology is useful particularly in decoding and rendering a bit stream in which two systems of object audio and ambisonic are superimposed, in converting and encoding object audio into ambisonic during encoding, or the like.

<Exemplary Configuration of Signal Processing Apparatus>

Figure 6:
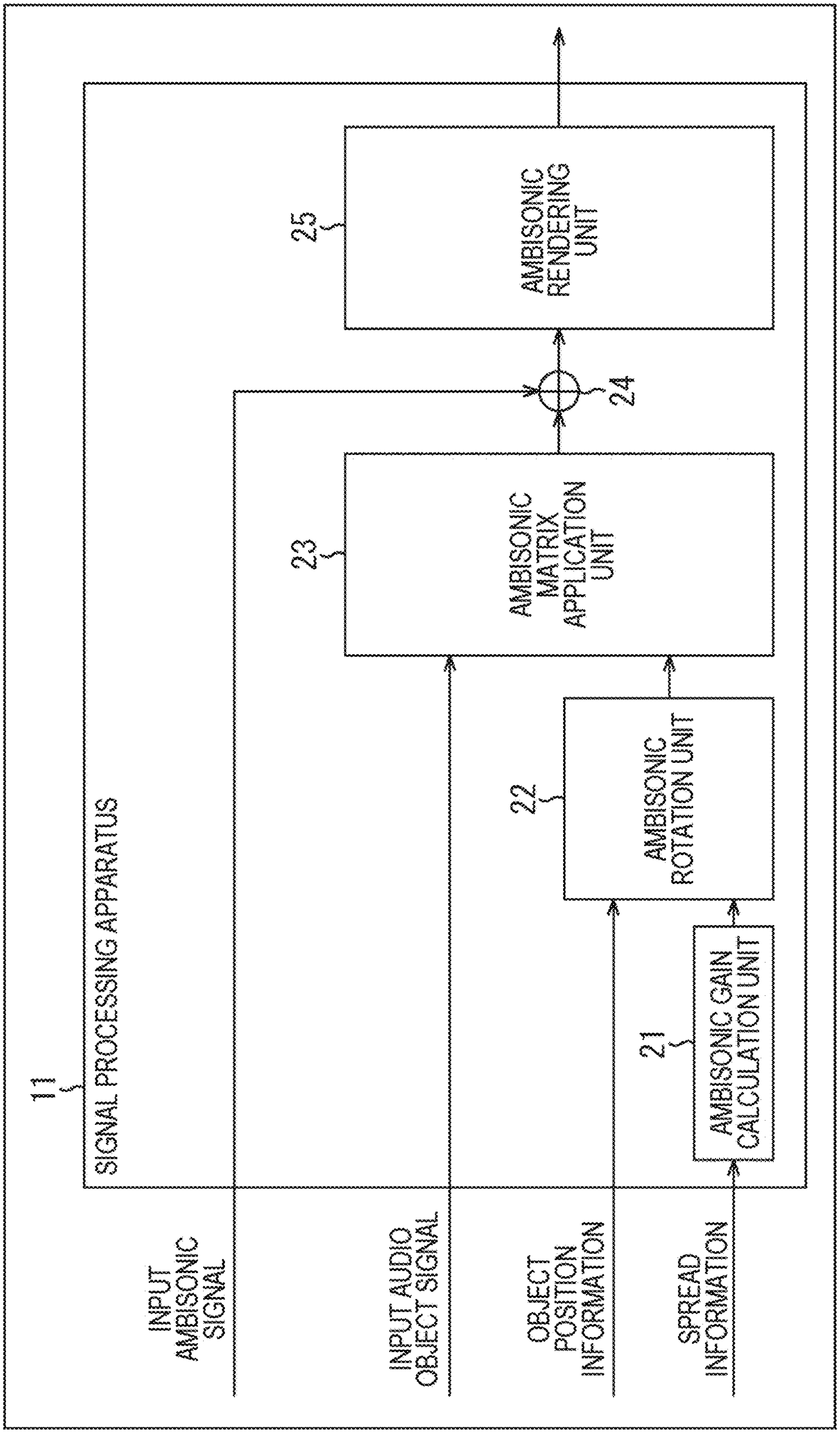
FIG. 6 is a diagram illustrating an exemplary configuration of a signal processing apparatus.

FIG. 6 is a diagram illustrating an exemplary configuration of one embodiment of a signal processing apparatus according to the present technology.

A signal processing apparatus 11 illustrated in FIG. 6 includes an ambisonic gain calculation unit 21, an ambisonic rotation unit 22, an ambisonic matrix application unit 23, an addition unit 24, and an ambisonic rendering unit 25.

The signal processing apparatus 11 is supplied with, as audio signals for reproducing sound of contents, an input ambisonic signal as an audio signal in the ambisonic form and an input audio object signal as an audio signal of sound of an audio object.

For example, the input ambisonic signal is a signal of an ambisonic channel $C_{n,m}$ corresponding to an order n and an order m of a spherical harmonic function $S_{n,m}(\theta, \phi)$. That is, the signal processing apparatus 11 is supplied with an input ambisonic signal of each ambisonic channel $C_{n,m}$.

To the contrary, the input audio object signal is a monaural audio signal for reproducing sound of one audio object, and the signal processing apparatus 11 is supplied with an input audio object signal of each audio object.

Further, the signal processing apparatus 11 is supplied with object position information and spread information as metadata for each audio object.

Here, the object position information contains position_azimuth, position_elevation, and position_radius described above.

position_azimuth indicates an azimuth angle indicating the spatial position of an audio object, position_elevation indicates an elevation angle indicating the spatial position of the audio object, and position_radius indicates a radius indicating the spatial position of the audio object.

Further, the spread information is spread described above, and is angle information indicating the size of the audio object, or a degree of spread of a sound image of the audio object.

Additionally, the description will be made assuming that the signal processing apparatus 11 is supplied with an input audio object signal, object position information, and spread information for one audio object in order to simplify the description below.

However, though not limited thereto, the signal processing apparatus 11 may be of course supplied with an input audio object signal, object position information, and spread information for a plurality of audio objects.

The ambisonic gain calculation unit 21 finds an ambisonic gain, on the basis of the supplied spread information, assuming that an audio object is at the front position, and supplies it to the ambisonic rotation unit 22.

Additionally, the front position is in the front direction viewed from a user position as a reference on the space, and is where position_azimuth and position_elevation as the object position information are 0 degree, respectively. In other words, the position at position_azimuth=0 and position_elevation=0 is the front position.

An ambisonic gain of an ambisonic channel $C_{n, m}$ of an audio object particularly in a case where the audio object is at the front position will be called front position ambisonic gain $G_{n, m}$ below.

For example, a front position ambisonic gain $G_{n, m}$ of each ambisonic channel $C_{n, m}$ is as follows.

That is, an input audio object signal is multiplied by a front position ambisonic gain $G_{n, m}$ of each ambisonic channel $C_{n, m}$ to be an ambisonic signal of each ambisonic channel $C_{n, m}$, in other words, a signal in the ambisonic form.

At this time, when the sound of the audio object is reproduced on the basis of the signal containing the ambisonic signals of the respective ambisonic channels $C_{n, m}$, a sound image of the sound of the audio object is oriented at the front position.

Additionally, in this case, the sound of the audio object has a spread with an angle indicated by the spread information. That is, a spread of sound can be expressed similarly as in a case where 19 spread audio objects are generated by use of the spread information.

Figure 7:
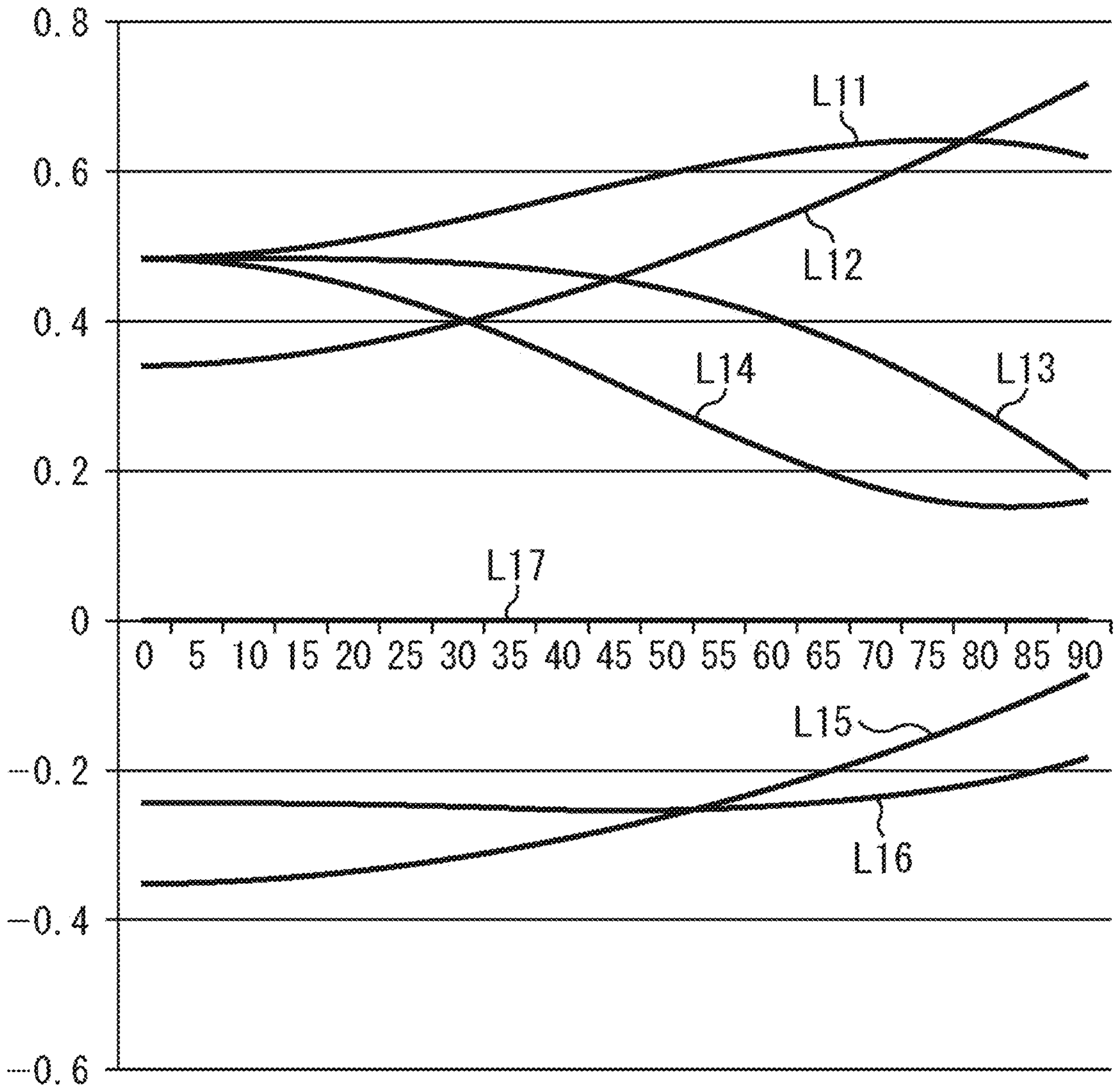
FIG. 7 is a diagram illustrating relationships between a spread angle and a front position ambisonic gain.

Here, a relationship between an angle indicated by the spread information (also called spread angle below) and a front position ambisonic gain $G_{n, m}$ of each ambisonic channel $C_{n, m}$ is as illustrated in FIG. 7. Additionally, the vertical axis in FIG. 7 indicates a value of the front position ambisonic gain $G_{n, m}$ and the horizontal axis indicates the spread angle.

A curve L11 to a curve L17 in FIG. 7 indicate a front position ambisonic gain $G_{n, m}$ of an ambisonic channel $C_{n, m}$ for each spread angle.

Specifically, the curve L11 indicates the front position ambisonic gain $G_{1, 1}$ of the ambisonic channel $C_{1, 1}$ when the order n and the order m of the spherical harmonic function $S_{n, m}$ (θ, ϕ) are 1, respectively, or at the order n=1 and the order m=1.

Similarly, the curve L12 indicates the front position ambisonic gain $G_{0, 0}$ of the ambisonic channel $C_{0, 0}$ corresponding to the order n=0 and the order m=0, and the curve L13 indicates the front position ambisonic gain $G_{2, 2}$ of the ambisonic channel $C_{2, 2}$ corresponding to the order n=2 and the order m=2.

Further, the curve L14 indicates the front position ambisonic gain $G_{3, 3}$ of the ambisonic channel $C_{3, 3}$ corresponding to the order n=3 and the order m=3, and the curve L15 indicates the front position ambisonic gain $G_{3, 1}$ of the ambisonic channel $C_{3, 1}$ corresponding to the order n=3 and the order m=1.

Further, the curve L16 indicates the front position ambisonic gain $G_{2, 0}$ of the ambisonic channel $C_{2, 0}$ corresponding to the order n=2 and the order m=0, and the curve L17 indicates ambisonic gains $G_{n, m}$ of ambisonic channels $C_{n, m}$ corresponding to the order n and the order m (where 0≤n≤3, −3≤m≤3) other than the above cases. That is, the curve L17 indicates the front position ambisonic gains of the ambisonic channels $C_{1, -1}$, $C_{1, 0}$, $C_{2, 1}$, $C_{2, -1}$, $C_{2, -2}$, $C_{3, 0}$, $C_{3, -1}$, $C_{3, 2}$, $C_{3, -2}$, and $C_{3, -3}$. Here, the front position ambisonic gains indicated by the curve L17 are 0 irrespective of the spread angle.

Additionally, the definition of spherical harmonic function $S_{n, m}$ (θ, ϕ) is described in detail in Chapter F.1.3 in "INTERNATIONAL STANDARD ISO/IEC 23008-3 First edition 2015 Oct. 15 Information technology—High efficiency coding and media delivery in heterogeneous environments—Part 3:3D audio", and thus the description thereof will be omitted.

The relationships between the spread angle and the front position ambisonic gain $G_{n, m}$ can be previously found.

Specifically, an elevation angle and an azimuth angle indicating a 3D spatial position of a spread audio objet found depending on a spread angle are assumed as θ and ϕ, respectively.

In particular, an elevation angle and an azimuth angle of an i-th (where 0≤i≤18) spread audio object out of 19 spread audio objects are denoted by $\theta_i$ and $\phi_i$, respectively. Additionally, the elevation angle $\theta_i$ and the azimuth angle $\phi_i$ correspond to position_elevation and position_azimuth described above, respectively.

In this case, the elevation angle $\theta_i$ and the azimuth angle $\phi_i$ of the spread audio object are substituted into the spherical harmonic function $S_{n, m}$ (θ, ϕ) and the resultant spherical harmonic functions $S_{n, m}(\theta_i, \phi_i)$ for the 19 spread audio objects are added, thereby finding a front position ambisonic gain $G_{n, m}$. That is, the front position ambisonic gain $G_{n, m}$ can be obtained by calculating the following Equation (6).

[Math. 6]

$$G_{n,m}=\Sigma_{i=0}^{18}S_{n,m}(\theta_i,\phi_i) \qquad (6)$$

In the calculation of Equation (6), the sum of the 19 spherical harmonic functions $S_{n, m}(\theta_i, \phi_i)$ obtained for the same ambisonic channel $C_{n, m}$ is assumed as the front position ambisonic gain $G_{n, m}$ of the ambisonic channel $C_{n, m}$.

That is, the spatial positions of a plurality of objects, or 19 spread audio objects in this case, are defined for the spread angle indicated by the spread information, and the angles indicating a position of each spread audio object are the elevation angle $\theta_i$ and the azimuth angle $\phi_i$.

Then, the value obtained by substituting the elevation angle $\theta_i$ and the azimuth angle $\phi_i$ of the spread audio object into the spherical harmonic function is the spherical harmonic function $S_{n, m}(\theta_i, \phi_i)$, and the sum of the spherical harmonic functions $S_{n, m}(\theta_i, \phi_i)$ obtained for the 19 spread audio objects is assumed as front position ambisonic gain $G_{n, m}$.

In the example illustrated in FIG. 7, only the ambisonic channels $C_{0, 0}$, $C_{1, 1}$, $C_{2, 0}$, $C_{2, 2}$, $C_{3, 1}$, and $C_{3, 3}$ substantially have the front position ambisonic gain $G_{n, m}$, and the front position ambisonic gains $G_{n, m}$ of the other ambisonic channels $C_{n, m}$ are 0.

For example, the ambisonic gain calculation unit 21 may use Equation (6) on the basis of the spread information to calculate a front position ambisonic gain $G_{n, m}$ of each ambisonic channel $C_{n,m}$; however, a front position ambisonic gain $G_{n,m}$ is acquired here by use of a gain table.

That is, the ambisonic gain calculation unit 21 previously generates and holds a gain table in which each spread angle and a front position ambisonic gain $G_{n,m}$ are associated per ambisonic channel $C_{n,m}$.

For example, in the gain table, the value of each spread angle may be associated with the value of a front position ambisonic gain $G_{n,m}$ corresponding to the spread angle. Further, the value of the front position ambisonic gain $G_{n,m}$ corresponding to a range of the value of the spread angle may be associated with the range, for example.

Additionally, a resolution of the spread angle in the gain table is only required to be defined depending on the amount of resources of an apparatus for reproducing sound of contents on the basis of the input audio object signal or the like, or reproduction quality required during reproduction of contents.

Further, as can be seen from FIG. 7, the front position ambisonic gain $G_{n,m}$ changes less for a change in the spread angle at a small spread angle. Thus, in the gain table, a range of the spread angle associated with one front position ambisonic gain $G_{n,m}$, or the step width of the spread angle may be increased for a small spread angle, and the step width may be decreased as the spread angle is larger.

Further, in a case where the spread angle indicated by the spread information takes an intermediate value of two spread angles in the gain table, or the like, the front position ambisonic gain $G_{n,m}$ may be found by performing interpolation processing such as linear interpolation.

In such a case, for example, the ambisonic gain calculation unit 21 performs the interpolation processing on the basis of a front position ambisonic gain $G_{n,m}$ associated with a spread angle in the gain table, thereby finding the front position ambisonic gain $G_{n,m}$ corresponding to the spread angle indicated by the spread information.

Specifically, for example, it is assumed that the spread angle indicated by the spread information is 65 degrees. Further, it is assumed that the spread angle "60 degrees" is associated with the front position ambisonic gain $G_{n,m}$ "0.2" and the spread angle "70 degrees" is associated with the front position ambisonic gain $G_{n,m}$ "0.3" in the gain table.

At this time, the ambisonic gain calculation unit 21 calculates the front position ambisonic gain $G_{n,m}$ "0.25" corresponding to the spread angle "65 degrees" in the linear interpolation processing on the basis of the spread information and the gain table.

As described above, the ambisonic gain calculation unit 21 previously holds the gain table obtained by expressing the front position ambisonic gains $G_{n,m}$ of the respective ambisonic channels $C_{n,m}$ changing depending on the spread angle in a table.

Thereby, a front position ambisonic gain $G_{n,m}$ can be obtained directly from the gain table without additionally generating 19 spread audio objects from the spread information. Calculation loads can be further reduced by use of the gain table than in a case where a front position ambisonic gain $G_{n,m}$ is directly calculated.

Additionally, there will be described an example in which an ambisonic gain while an audio object is at the front position is found by the ambisonic gain calculation unit 21. However, an ambisonic gain while an audio object is at another reference position, not limited to the front position, may be found by the ambisonic gain calculation unit 21.

Returning to the description of FIG. 6, the ambisonic gain calculation unit 21 finds a front position ambisonic gain $G_{n,m}$ of each ambisonic channel $C_{n,m}$ on the basis of the supplied spread information and the holding gain table, and then supplies the resultant front position ambisonic gain $G_{n,m}$ to the ambisonic rotation unit 22.

The ambisonic rotation unit 22 performs rotation processing on the front position ambisonic gain $G_{n,m}$ supplied from the ambisonic gain calculation unit 21 on the basis of the supplied object position information.

The ambisonic rotation unit 22 supplies an object position ambisonic gain $G'_{n,m}$ of each ambisonic channel $C_{n,m}$ obtained by the rotation processing to the ambisonic matrix application unit 23.

Here, the object position ambisonic gain $G'_{n,m}$ is an ambisonic gain assuming that the audio object is at a position indicated by the object position information, in other words, at an actual position of the audio object.

Thus, the position of the audio object is rotated and moved from the front position to the original position of the audio object in the rotation processing, and the ambisonic gain after the rotation and movement is calculated as an object position ambisonic gain $G'_{n,m}$.

In other words, the front position ambisonic gain $G_{n,m}$ corresponding to the front position is rotated and moved, and the object position ambisonic gain $G'_{n,m}$ corresponding to the actual position of the audio object indicated by the object position information is calculated.

During the rotation processing, a product of a rotation matrix M depending on the rotation angle of the audio object, in other words, the rotation angle of the ambisonic gain, and a matrix G including the front position ambisonic gains $G_{n,m}$ of the respective ambisonic channels $C_{n,m}$ is found as indicated in the following Equation (7). Then, the elements of the resultant matrix G' are assumed as objet position ambisonic gains $G'_{n,m}$ of the respective ambisonic channels $C_{n,m}$. The rotation angle herein is a rotation angle when the audio object is rotated from the front position to the position indicated by the object position information.

[Math. 7]

$$G'=MG \tag{7}$$

Additionally, the rotation matrix M is described in "Wigner-D functions, J. Sakurai, J. Napolitano, "Modern Quantum Mechanics", Addison-Wesley, 2010" and the like, for example, and the rotation matrix M is a block diagonal matrix indicated in the following Equation (8) in the case of 2-order ambisonic.

[Math. 8]

$$M|_{N=2} = \begin{bmatrix} 1 & 0 & 0 \\ 0 & [3\times 3] & 0 \\ 0 & 0 & [5\times 5] \end{bmatrix} \tag{8}$$

In the example indicated in Equation (8), the matrix elements in the non-diagonal block components in the rotation matrix M are 0, thereby reducing calculation cost of the processing of multiplying the front position ambisonic gain $G_{n,m}$ by the rotation matrix M.

As described above, the ambisonic gain calculation unit 21 and the ambisonic rotation unit 22 calculate an object position ambisonic gain $G'_{n,m}$ of an audio object on the basis of the spread information and the object position information.

The ambisonic matrix application unit 23 converts the supplied input audio object signal into a signal in the ambisonic form on the basis of the object position ambisonic gain $G'_{n, m}$ supplied from the ambisonic rotation unit 22.

Here, assuming the input audio object signal being a monaural time signal is denoted by Obj(t), the ambisonic matrix application unit 23 calculates the following Equation (9) to find an output ambisonic signal $C_{n, m}(t)$ of each ambisonic channel $C_{n, m}$.

[Math. 9]

$$C_{n,m}(t)=G'_{n,m}Obj(t) \quad (9)$$

In Equation (9), an input audio objet signal Obj(t) is multiplied by an object position ambisonic gain $G'_{n, m}$ of a predetermined ambisonic channel $C_{n, m}$, thereby, obtaining an output ambisonic signal $C_{n, m}(t)$ of the ambisonic channel $C_{n, m}$.

Equation (9) is calculated for each ambisonic channel $C_{n, m}$ so that the input audio object signal Obj(t) is converted into a signal in the ambisonic form containing the output ambisonic signals $C_{n, m}(t)$ of the each ambisonic channel $C_{n, m}$.

The thus-obtained output ambisonic signals $C_{n, m}(t)$ reproduce sound similar to the sound based on the input audio object signal reproduced when 19 spread audio objects are generated by use of the spread information.

That is, the output ambisonic signal $C_{n, m}(t)$ is a signal in the ambisonic form for reproducing the sound of the audio object capable of orienting a sound image at the position indicated by the object position information and expressing a spread of the sound indicated by the spread information.

The input audio object signal Obj(t) is converted into the output ambisonic signal $C_{n, m}(t)$ in this way, thereby realizing audio reproduction with the less processing amount. That is, calculation loads of the rendering processing can be reduced.

The ambisonic matrix application unit 23 supplies the thus-obtained output ambisonic signal $C_{n, m}(t)$ of each ambisonic channel $C_{n, m}$ to the addition unit 24.

Such an ambisonic matrix application unit 23 functions as an ambisonic signal generation unit for generating an output ambisonic signal $C_{n, m}(t)$ on the basis of an input audio object signal Obj(t) of an audio object and an object position ambisonic gain $G'_{n, m}$.

The addition unit 24 adds the output ambisonic signal $C_{n, m}(t)$ supplied from the ambisonic matrix application unit 23 and the supplied input ambisonic signal per ambisonic channel $C_{n, m}$, and supplies the resultant ambisonic signal $C'_{n, m}(t)$ to the ambisonic rendering unit 25. That is, the addition unit 24 mixes the output ambisonic signal $C_{n, m}(t)$ and the input ambisonic signal.

The ambisonic rendering unit 25 finds an output audio signal $O_k(t)$ supplied to each output speaker on the basis of an ambisonic signal $C'_{n, m}(t)$ of each ambisonic channel $C_{n, m}$ supplied from the addition unit 24 and a matrix called decoding matrix corresponding to the 3D spatial positions of the output speakers (not illustrated).

For example, a column vector (matrix) containing the ambisonic signals $C'_{n, m}(t)$ of the respective ambisonic channels $C_{n, m}$ is denoted by vector C, and a column vector (matrix) containing the output audio signals $O_k(t)$ of the respective audio channels k corresponding to the respective output speakers is denoted by vector O. Further, a decoding matrix is denoted as D.

In this case, the ambisonic rendering unit 25 finds a product of the decoding matrix D and the vector C to calculate the vector O, as indicated in the following Equation (10), for example.

[Math. 10]

$$O=DC \quad (10)$$

Additionally, the decoding matrix D is a matrix with the ambisonic channels $C_{n, m}$ as rows and the audio channels k as columns in Equation (10).

Various methods are employed for the decoding matrix D creation method. For example, the decoding matrix D may be found by directly calculation the inverse matrix of a matrix having, as elements, the spherical harmonic functions $S_{n, m}(\theta, \phi)$ which are found by substituting the elevation angle θ and the azimuth angle ϕ indicating the 3D spatial position of an output speaker.

Additionally, the decoding matrix calculation method for enhancing quality of the output audio signals is described in Chapter 12.4.3.3 in "INTERNATIONAL STANDARD ISO/IEC 23008-3 First edition 2015-10-15 Information technology—High efficiency coding and media delivery in heterogeneous environments—Part 3:3D audio", for example.

The ambisonic rendering unit 25 outputs the thus-obtained output audio signal $O_k(t)$ of each audio channel k to the output speaker corresponding to the audio channel k, for example.

<Description of Content Rendering Processing>

The operations of the signal processing apparatus 11 described above will be described below. That is, the content rendering processing by the signal processing apparatus 11 will be described below with reference to the flowchart of FIG. 8.

In step S11, the ambisonic gain calculation unit 21 finds a front position ambisonic gain $G_{n, m}$ per ambisonic channel $C_{n, m}$ on the basis of the supplied spread information, and supplies it to the ambisonic rotation unit 22.

For example, the ambisonic gain calculation unit 21 reads, from the holding gain table, the front position ambisonic gain $G_{n, m}$ associated with the spread angle indicated by the supplied spread information, thereby obtaining the front position ambisonic gain $G_{n, m}$ of the ambisonic channel $C_{n, m}$. At this time, the ambisonic gain calculation unit 21 performs the interpolation processing, as needed, to find the front position ambisonic gain $G_{n, m}$.

In step S12, the ambisonic rotation unit 22 performs the rotation processing on the front position ambisonic gain $G_{n, m}$ supplied from the ambisonic gain calculation unit 21 on the basis of the supplied object position information.

That is, the ambisonic rotation unit 22 calculates Equation (7) described above, on the basis of the rotation matrix M defined by the object position information, to calculate an object position ambisonic gain $G'_{n, m}$ of each ambisonic channel $C_{n, m}$, for example.

The ambisonic rotation unit 22 supplies the resultant object position ambisonic gain $G'_{n, m}$ to the ambisonic matrix application unit 23.

In step S13, the ambisonic matrix application unit 23 generates an output ambisonic signal $C_{n, m}(t)$ on the basis of the object position ambisonic gain $G'_{n, m}$ supplied from the ambisonic rotation unit 22 and the supplied input audio object signal.

For example, the ambisonic matrix application unit 23 calculates Equation (9) described above, thereby calculating an output ambisonic signal $C_{n, m}(t)$ per ambisonic channel $C_{n, m}$. The ambisonic matrix application unit 23 supplies the resultant output ambisonic signal $C_{n, m}(t)$ to the addition unit 24.

In step S14, the addition unit 24 mixes the output ambisonic signal $C_{n, m}(t)$ supplied from the ambisonic matrix application unit 23 and the supplied input ambisonic signal.

That is, the addition unit 24 adds the output ambisonic signal $C_{n,m}(t)$ and the input ambisonic signal per ambisonic channel $C_{n,m}$ and supplies the resultant ambisonic signal $C'_{n,m}(t)$ to the ambisonic rendering unit 25.

In step S15, the ambisonic rendering unit 25 generates an output audio signal $O_k(t)$ of each audio channel k on the basis of the ambisonic signal $C'_{n,m}(t)$ supplied from the addition unit 24.

For example, the ambisonic rendering unit 25 calculates Equation (10) described above, thereby finding an output audio signal $O_k(t)$ of each audio channel k.

When obtaining the output audio signal $O_k(t)$, the ambisonic rendering unit 25 outputs the resultant output audio signal $O_k(t)$ to the subsequent phase, and the content rendering processing ends.

As described above, the signal processing apparatus 11 calculates an object position ambisonic gain on the basis of the spread information and the object position information, and converts an input audio object signal to a signal in the ambisonic form on the basis of the object position ambisonic gain. The input audio object signal is converted into the signal in the ambisonic form in this way, thereby reducing calculation loads of the rendering processing.

Second Embodiment

<Ambisonic Gain>

Incidentally, it is assumed above that a spread, or a form of an audio object changes only by one spread angle. However, a method for realizing an oval spread by two spread angles $\alpha_{width}$ and $\alpha_{height}$ is described in MPEG-H 3D Audio Phase 2.

For example, MPEG-H 3D Audio Phase 2 is described in detail in "INTERNATIONAL STANDARD ISO/IEC 23008-3: 2015/FDAM3: 2016 Information technology—High efficiency coding and media delivery in heterogeneous environments—Part 3:3D audio, AMENDMENT 3: MPEG-H 3D Audio Phase 2".

The signal processing apparatus 11 can obtain a front position ambisonic gain from the spread information also in a case where such two spread angles are used.

There will be described below an example in which the spread information includes the spread angle $\alpha_{width}$ in the horizontal direction, in other words, in the azimuth angle direction, and the spread angle $\alpha_{height}$ in the vertical direction, in other words, in the elevation angle direction.

FIG. 9 is a diagram illustrating an exemplary format of metadata of an audio object in a case where the spread information includes the spread angle $\alpha_{width}$ and the spread angle $\alpha_{height}$. Additionally, the description of the parts corresponding to those in FIG. 1 will be omitted in FIG. 9.

In the example illustrated in FIG. 9, spread_width[i] and spread_height[i] are stored in the spread information instead of spread[i] in the example illustrated in FIG. 1.

In this example, spread_width [i] indicates the spread angle $\alpha_{width}$ of an i-th audio object, and spread_height[i] indicates the spread angle $\alpha_{height}$ of an i-th audio object.

In the method based on MPEG-H 3D Audio Phase 2, the ratio $\alpha_r$ between two spread angles $\alpha_{width}$ and $\alpha_{height}$ is first found in the following Equation (11).

[Math. 11]

$$\alpha_r = \frac{\alpha_{height}}{\alpha_{width}} \tag{11}$$

Then, the basic vector v indicated in Equation (1) described above is multiplied by the ratio $\alpha_r$ of the spread angles, thereby correcting the basic vector v as indicated in the following Equation (12).

[Math. 12]

$$v' = v \cdot \alpha_r \tag{12}$$

Additionally, v' in Equation (12) indicates the corrected basic vector multiplied by the ratio $\alpha_r$ of the spread angles.

Further, Equation (2) and Equation (3) described above are calculated as they are, and the angle α' in Equation (4), in which the spread angle $\alpha_{width}$ is limited between 0.001 degrees and 90 degrees, is used. Further, the spread angle $\alpha_{width}$ is used as the angle α in Equation (5) for calculation.

In the method based on MPEG-H 3D Audio Phase 2, 19 spread audio objects are generated in the above calculations, and an audio object in a pseudo size is expressed.

Figure 10:
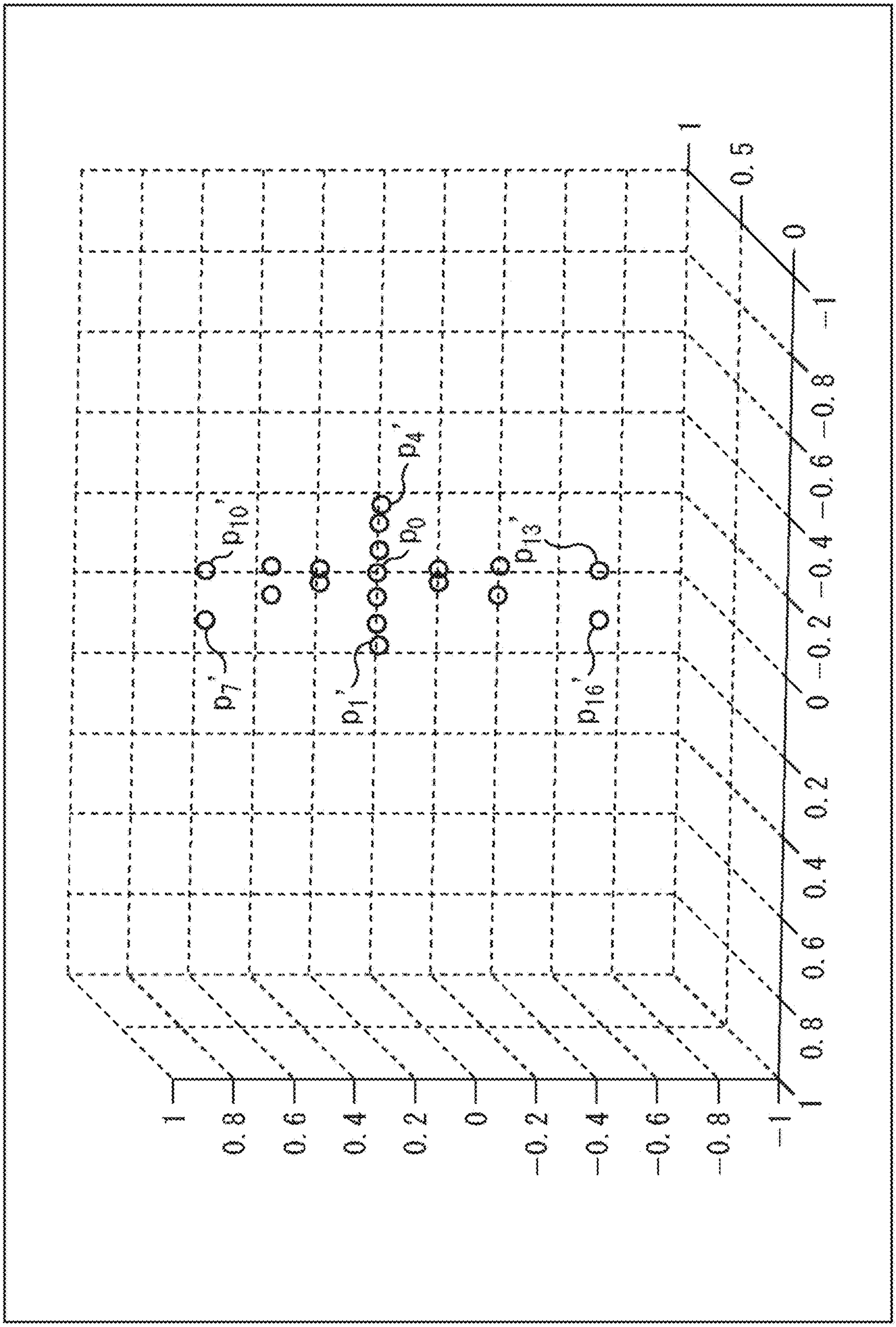
FIG. 10 is a diagram for explaining spread audio objects.

For example, when 19 spread audio objects obtained in a case where the spread angle $\alpha_{width}$ and the spread angle $\alpha_{height}$ are 10 degrees and 60 degrees, respectively, are plotted on the 3D orthogonal coordinate system, FIG. 10 is obtained. Additionally, one circle indicates one spread audio object in FIG. 10.

Figure 11:
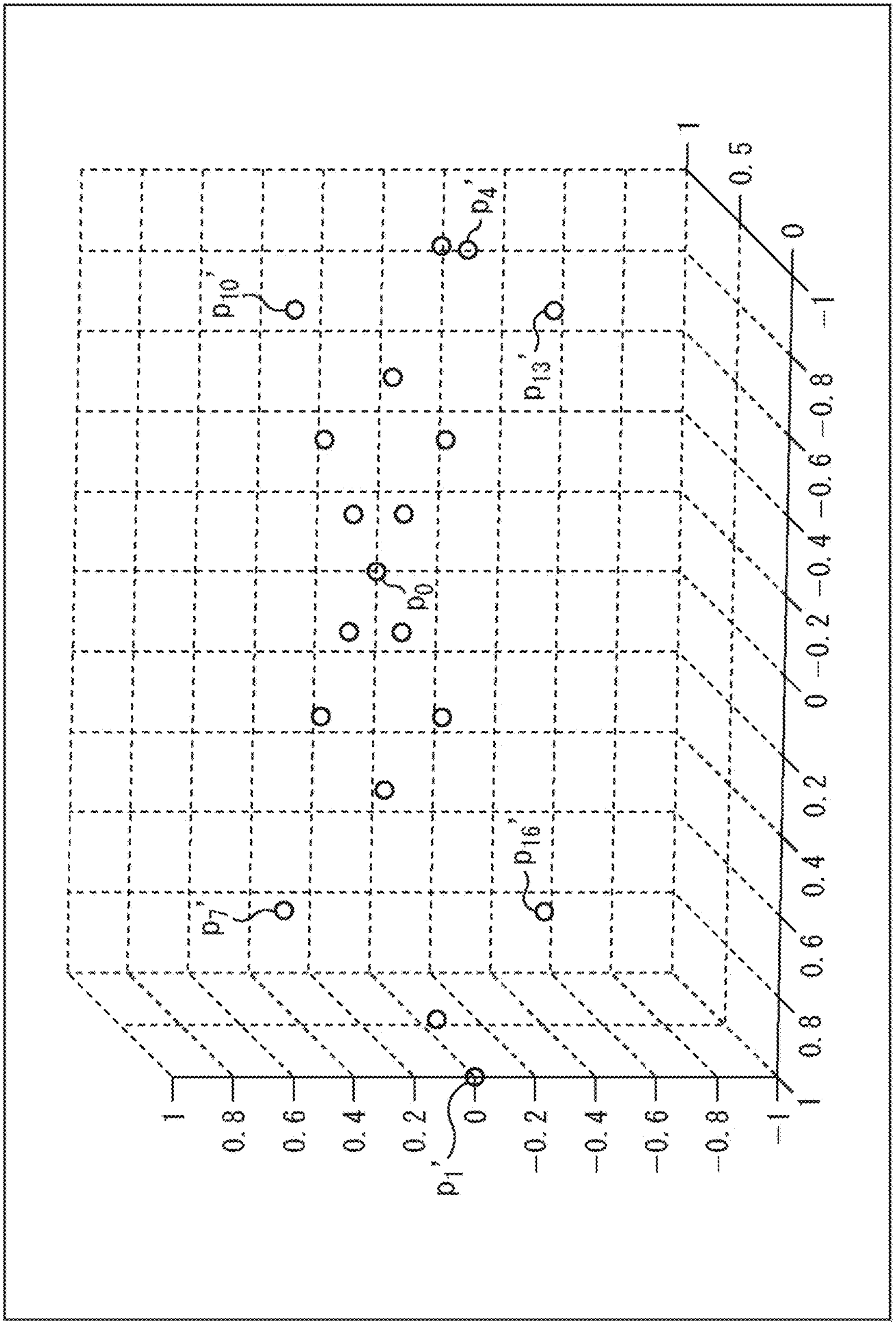
FIG. 11 is a diagram for explaining spread audio objects.

Similarly, when 19 spread audio objects obtained in a case where the spread angle $\alpha_{width}$ and the spread angle $\alpha_{height}$ are 90 degrees and 30 degrees, respectively, are plotted on the 3D orthogonal coordinate system, for example, FIG. 11 is obtained. Additionally, one circle indicates one spread audio object in FIG. 11.

Also in a case where the spread angle $\alpha_{width}$ and the spread angle $\alpha_{height}$ are included in the spread information as in the method based on MPEG-H 3D Audio Phase 2, or the like, 19 spread audio objects are generated. Thus, calculation loads of the rendering processing remain high.

To the contrary, also in a case where the spread angle $\alpha_{width}$ and the spread angle $\alpha_{height}$ are included in the spread information, the signal processing apparatus 11 can obtain a front position ambisonic gain $G_{n,m}$ by use of the gain table similarly as in the first embodiment described above.

That is, according to the first embodiment, the ambisonic gain calculation unit 21 holds the gain table in which one front position ambisonic gain $G_{n,m}$ is associated with one spread angle indicated by the spread information, for example.

To the contrary, in a case where the spread angle $\alpha_{width}$ and the spread angle $\alpha_{height}$ are included in the spread information, the gain table in which one front position ambisonic gain $G_{n,m}$ is associated with a combination of the spread angle $\alpha_{width}$ and the spread angle $\alpha_{height}$ is held in the ambisonic gain calculation unit 21.

Figure 12:
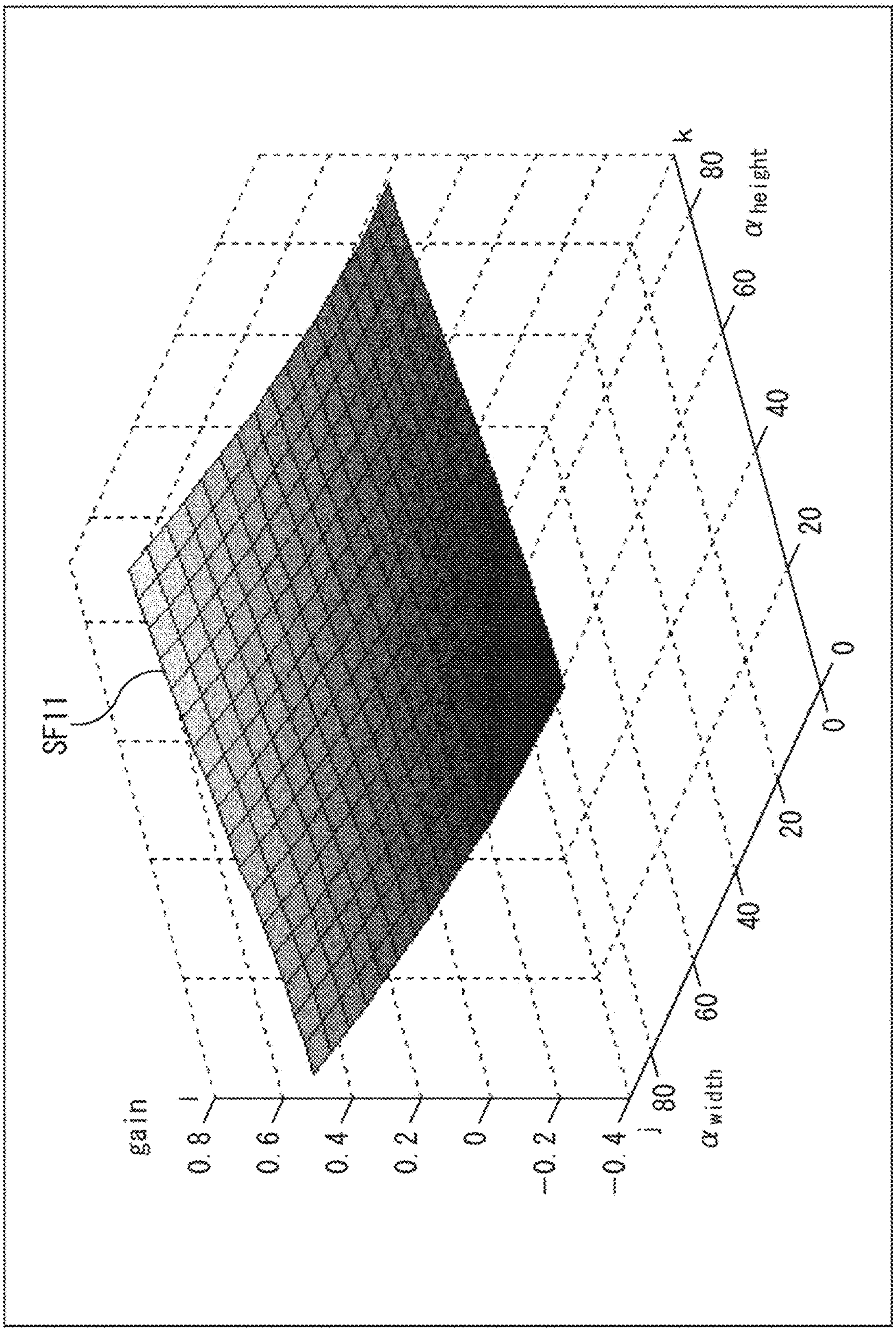
FIG. 12 is a diagram illustrating a relationship between a spread angle and a front position ambisonic gain.

For example, a relationship between the spread angle $\alpha_{width}$ and the spread angle $\alpha_{height}$, and the front position ambisonic gain $G_{0,0}$ of the ambisonic channel $C_{0,0}$ is as illustrated in FIG. 12.

Additionally, the j-axis in FIG. 12 indicates the spread angle $\alpha_{width}$, the k-axis indicates the spread angle $\alpha_{height}$, and the 1-axis indicates the front position ambisonic gain $G_{0,0}$.

In this example, the curved surface SF11 indicates the front position ambisonic gain $G_{0,0}$ defined for each combination of the spread angle $\alpha_{width}$ and the spread angle $\alpha_{height}$.

In particular, a curve passing from a point where the spread angle width and the spread angle $\alpha_{height}$ are 0 degree, respectively, to a point where the spread angle $\alpha_{width}$ and the spread angle $\alpha_{height}$ are 90 degrees, respectively, on the curved surface SF11 corresponds to the curve L12 illustrated in FIG. 7.

The ambisonic gain calculation unit 21 holds the table obtained in the relationship indicated on such a curved surface SF11 as a gain table of the ambisonic channel $C_{0,0}$.

Figure 13:
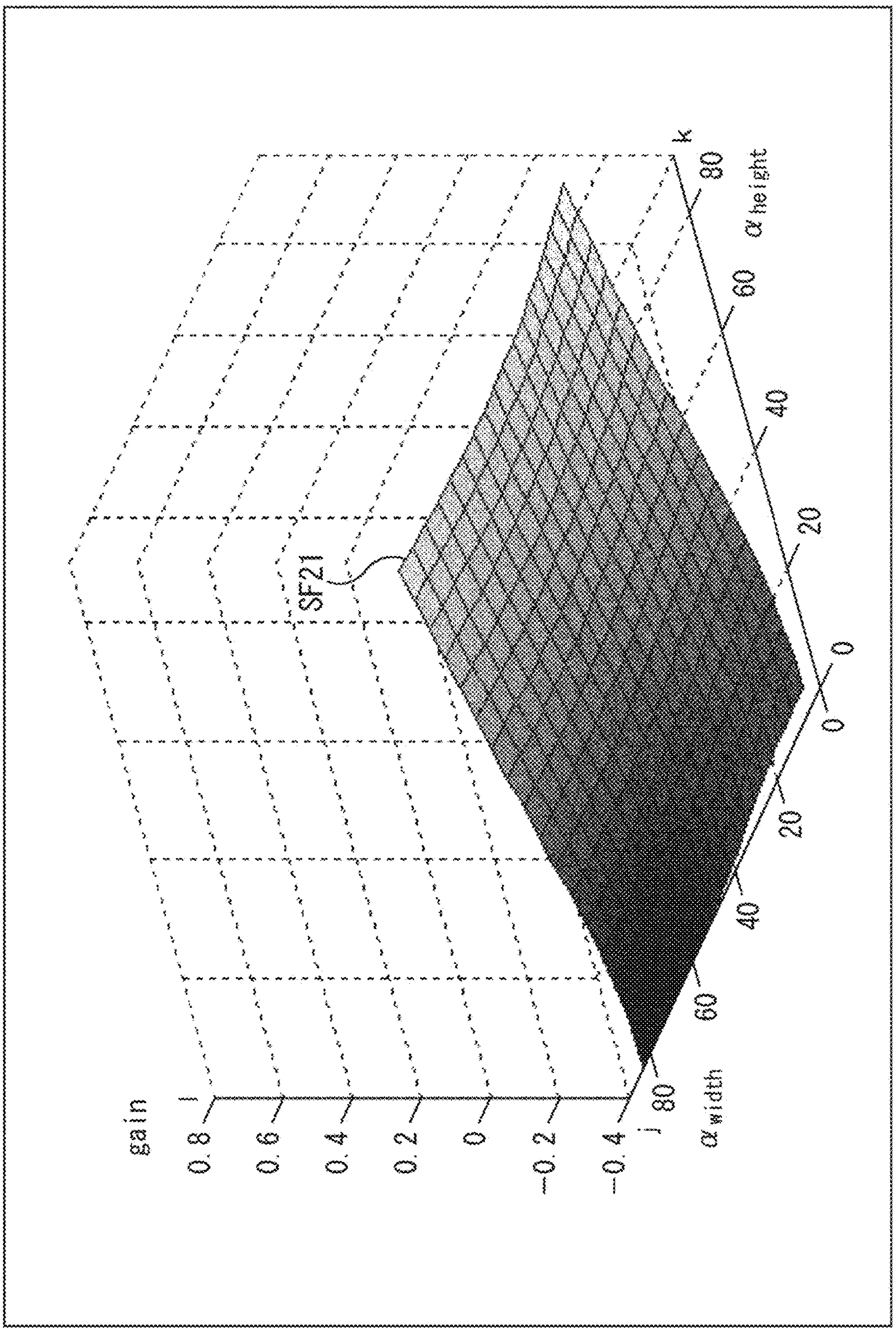
FIG. 13 is a diagram illustrating a relationship between a spread angle and a front position ambisonic gain.

Similarly, a relationship between the spread angle $\alpha_{width}$ and the spread angle $\alpha_{height}$, and the front position ambisonic gain $G_{3,1}$ of the ambisonic channel $C_{3,1}$ is as illustrated in FIG. 13, for example.

Additionally, the j-axis in FIG. 13 indicates the spread angle $\alpha_{width}$, the k-axis indicates the spread angle $\alpha_{height}$, and the l-axis indicates the front position ambisonic gain $G_{3,1}$.

In this example, the curved surface SF21 indicates the front position ambisonic gain $G_{3,1}$ defined for each combination of the spread angle $\alpha_{width}$ and the spread angle $\alpha_{height}$.

The ambisonic gain calculation unit 21 holds the gain table in which the spread angle $\alpha_{width}$ and the spread angle $\alpha_{height}$ are associated with the front position ambisonic gain $G_{n,m}$ per ambisonic channel $C_{n,m}$.

Figure 8:
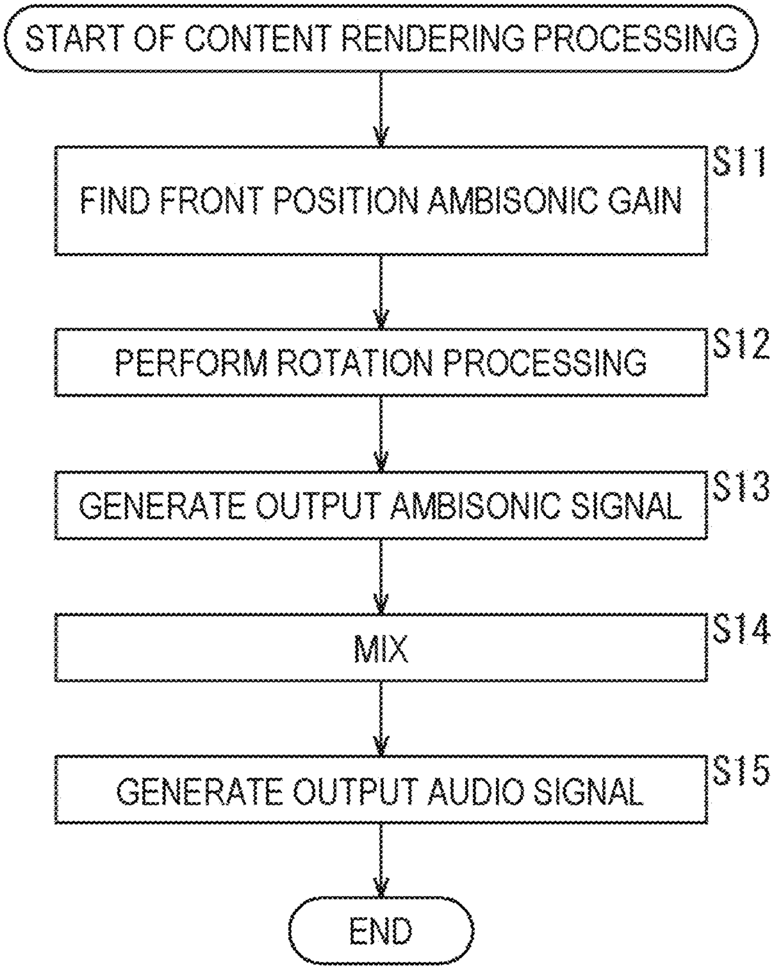
FIG. 8 is a flowchart for explaining content rendering processing.

Thus, also in a case where the spread angle $\alpha_{width}$ and the spread angle $\alpha_{height}$ are included in the spread information, the ambisonic gain calculation unit 21 finds a front position ambisonic gain $G_{n,m}$ of each ambisonic channel $C_{n,m}$ by use of the gain table in step S11 in FIG. 8. That is, the ambisonic gain calculation unit 21 reads a front position ambisonic gain $G_{n,m}$ from the gain table on the basis of the spread angle $\alpha_{width}$ and the spread angle $\alpha_{height}$ included in the supplied spread information, thereby obtaining a front position ambisonic gain $G_{n,m}$ of each ambisonic channel $C_{n,m}$. Additionally, also in this case, the interpolation processing is performed as needed.

By doing so, the signal processing apparatus 11 can directly obtain a front position ambisonic gain $G_{n,m}$ from the gain table without generating 19 spread audio objects. Further, the input audio object signal can be converted into a signal in the ambisonic form by use of the front position ambisonic gain $G_{n,m}$. Thereby, calculation loads of the rendering processing can be reduced.

As described above, the present technology is applicable also to an oval spread handled in MPEG-H 3D Audio Phase 2. Further, the present technology is applicable also to a spread in a complicated shape such as a square or star not described in MPEG-H 3D Audio Phase 2.

The method for converting an input audio object signal to a signal in the ambisonic form without generating 19 spread audio objects according to the standard described in MPEG-H Part 3:3D audio or MPEG-H 3D Audio Phase 2 has been described according to the first embodiment and the second embodiment. However, if the consistency with the standards does not need to be considered, the processing can be performed in the method according to the present technology described above assuming that more than 19 objects are similarly distributed inside an audio object with a spread. Also in such a case, a higher calculation cost reduction effect can be obtained according to the present technology.

<Application 1 of Present Technology>

Specific applications of the present technology described above will be subsequently described.

The description will be first made assuming that the present technology is applied to an audio codec decoder.

Figure 14:
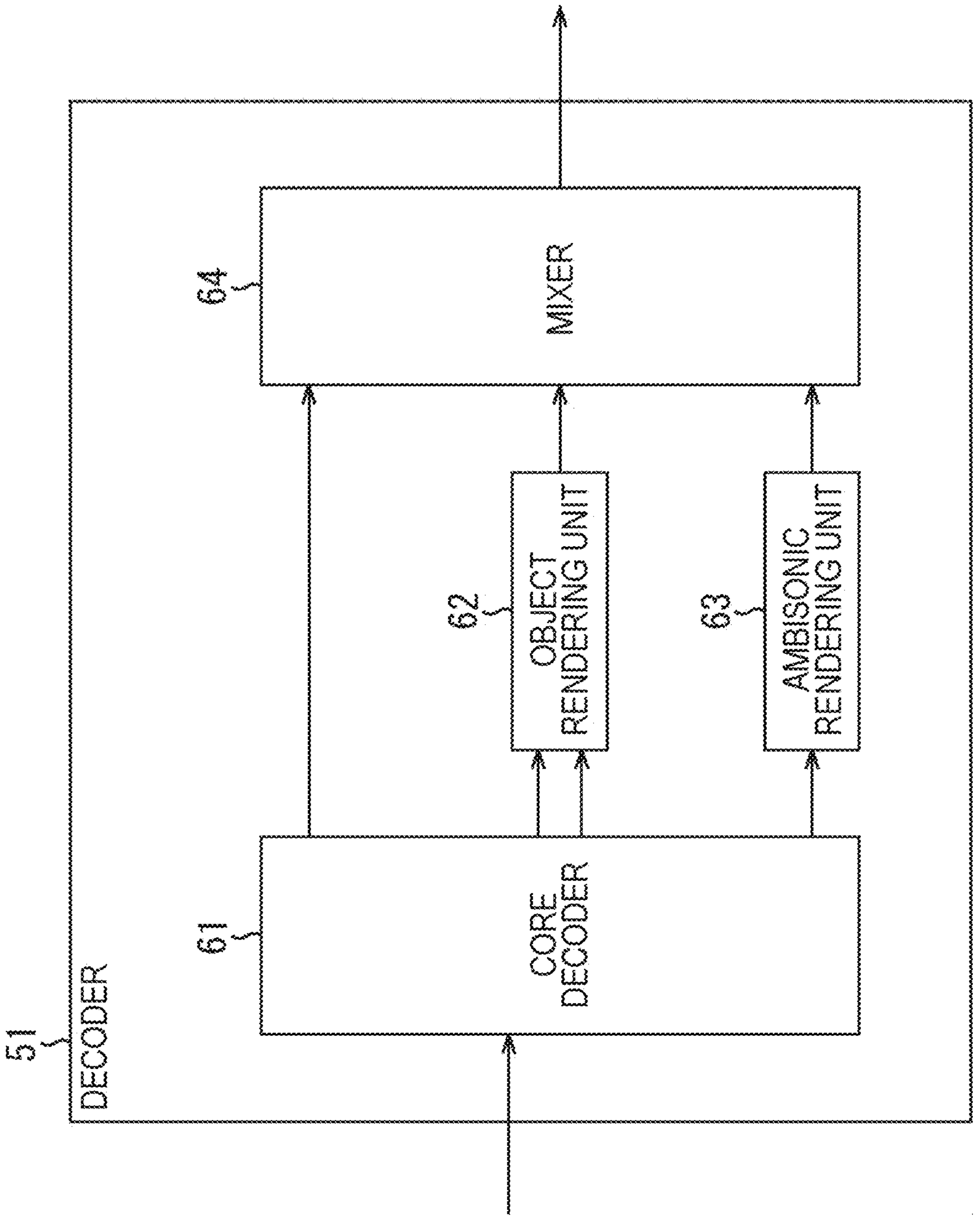
FIG. 14 is a diagram illustrating an exemplary configuration of a decoder.

A typical decoder is configured as illustrated in FIG. 14, for example.

A decoder 51 illustrated in FIG. 14 includes a core decoder 61, an object rendering unit 62, an ambisonic rendering unit 63, and a mixer 64.

When the decoder 51 is supplied with an input bit stream, decoding processing is performed on the input bit stream in the core decoder 61 and, thereby, a channel signal, an audio object signal, metadata of an audio object, and an ambisonic signal are obtained.

Here, the channel signal is an audio signal of each audio channel. Further, the metadata of the audio object includes object position information and spread information.

Rendering processing based on a 3D spatial position of an output speaker (not illustrated) is then performed in the object rendering unit 62.

The metadata input into the object rendering unit 62 includes spread information in addition to object position information indicating a 3D spatial position of an audio object.

For example, in a case where the spread angle indicated by the spread information is not 0 degree, virtual objects depending on the spread angle, or 19 spread audio objects are generated. The rendering processing is then performed on the 19 spread audio objects, and the resultant audio signals of the respective audio channels are supplied as object output signals to the mixer 64.

Further, a decoding matrix based on the 3D spatial positions of the output speakers and the number of ambisonic channels is generated in the ambisonic rendering unit 63. The ambisonic rendering unit 63 then makes a similar calculation to Equation (10) described above on the basis of the decoding matrix and the ambisonic signal supplied from the core decoder 61, and supplies the resultant ambisonic output signal to the mixer 64.

The mixer 64 performs mixing processing on the channel signal from the core decoder 61, the object output signal from the object rendering unit 62, and the ambisonic output signal from the ambisonic rendering unit 63, to generate the final output audio signal. That is, the channel signal, the object output signal, and the ambisonic output signal are added per audio channel to be the output audio signal.

The processing amount of the rendering processing performed particularly in the object rendering unit 62 increases in such a decoder 51.

Figure 15:
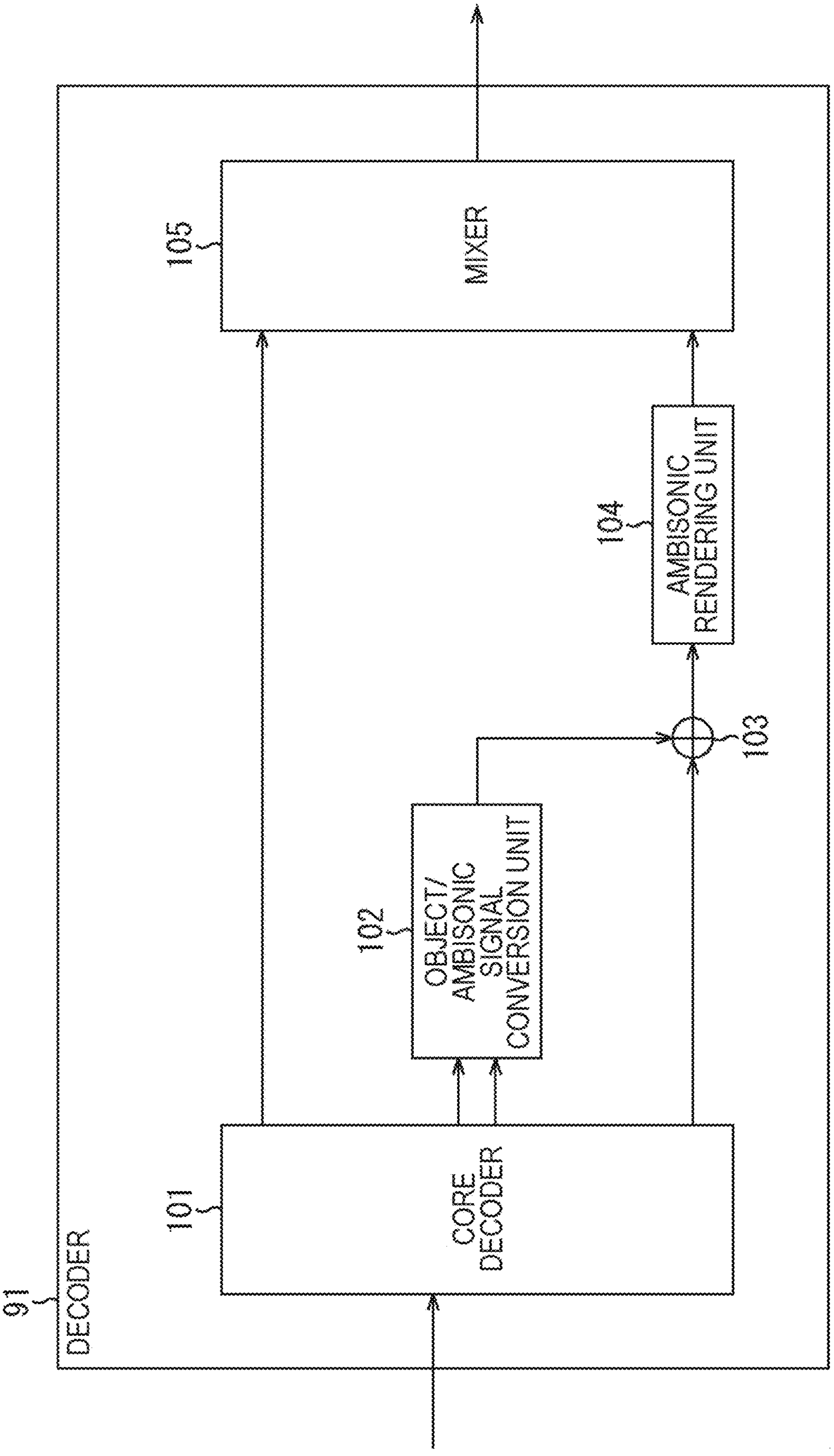
FIG. 15 is a diagram illustrating an exemplary configuration of a decoder.

To the contrary, in a case where the present technology is applied to a decoder, a decoder is configured as illustrated in FIG. 15, for example.

A decoder 91 illustrated in FIG. 15 includes a core decoder 101, an object/ambisonic signal conversion unit 102, an addition unit 103, an ambisonic rendering unit 104, and a mixer 105.

In the decoder 91, decoding processing is performed on an input bit stream in the core decoder 101 to obtain a channel signal, an audio object signal, metadata of an audio object, and an ambisonic signal.

The core decoder 101 supplies the channel signal obtained in the decoding processing to the mixer 105, supplies the audio object signal and the metadata to the object/ambisonic signal conversion unit 102, and supplies the ambisonic signal to the addition unit 103.

The object/ambisonic signal conversion unit 102 includes the ambisonic gain calculation unit 21, the ambisonic rotation unit 22, and the ambisonic matrix application unit 23 illustrated in FIG. 6.

The object/ambisonic signal conversion unit 102 calculates an object position ambisonic gain of each ambisonic channel on the basis of object position information and spread information included in the metadata supplied from the core decoder 101.

Further, the object/ambisonic signal conversion unit 102 finds an ambisonic signal of each ambisonic channel and supplies it to the addition unit 103 on the basis of the calculated object position ambisonic gain and the supplied audio object signal.

That is, the object/ambisonic signal conversion unit 102 converts the audio object signal to an ambisonic signal in the ambisonic form on the basis of the metadata.

As described above, the audio object signal can be directly converted to the ambisonic signal during conversion from the audio object signal to the ambisonic signal without generating 19 spread audio objects. Thereby, the calculation amount can be more largely reduced than in a case where the rendering processing is performed in the object rendering unit 62 illustrated in FIG. 14.

The addition unit 103 mixes the ambisonic signal supplied from the object/ambisonic signal conversion unit 102 and the ambisonic signal supplied from the core decoder 101. That is, the addition unit 103 adds the ambisonic signal supplied from the object/ambisonic signal conversion unit 102 and the ambisonic signal supplied from the core decoder 101 per ambisonic channel, and supplies the resultant ambisonic signal to the ambisonic rendering unit 104.

The ambisonic rendering unit 104 generates an ambisonic output signal on the basis of the ambisonic signal supplied from the addition unit 103 and the decoding matrix based on the 3D spatial positions of the output speakers and the number of ambisonic channels. That is, the ambisonic rendering unit 104 makes a similar calculation to Equation (10) described above to generate an ambisonic output signal of each audio channel, and supplies it to the mixer 105.

The mixer 105 mixes the channel signal supplied from the core decoder 101 and the ambisonic output signal supplied from the ambisonic rendering unit 104, and outputs the resultant output audio signal to the subsequent phase. That is, the channel signal and the ambisonic output signal are added per audio channel to be the output audio signal.

If the present technology is applied to a decoder in this way, the calculation amount during rendering can be remarkably reduced.

<Application 2 of Present Technology>

Further, the present technology is applicable also to an encoder for performing pre-rendering processing, not limited to a decoder.

For example, the bit rate of an output bit stream output from an encoder, or the number of processing channels of audio signals in a decoder is to be reduced.

It is assumed herein that an input channel signal, an input audio objet signal, and an input ambisonic signal, which are in mutually-different forms, are input into an encoder.

At this time, conversion processing is performed on the input channel signal and the input audio object signal, and all the signals are made in the ambisonic form to be subjected to the encoding processing in a core encoder, thereby reducing the number of channels to be handled and the bit rate of the output bit stream. Thereby, the processing amount in the decoder can be also reduced.

The processing is generally called pre-rendering processing. In a case where spread information is included in metadata of an audio object as described above, 19 spread audio objects are generated depending on a spread angle. The processing of converting the 19 spread audio objects into signals in the ambisonic form is then performed, and thus the processing amount increases.

Thus, the input audio object signal is converted into the signal in the ambisonic form by use of the present technology, thereby reducing the processing amount or the calculation amount in the encoder.

Figure 16:
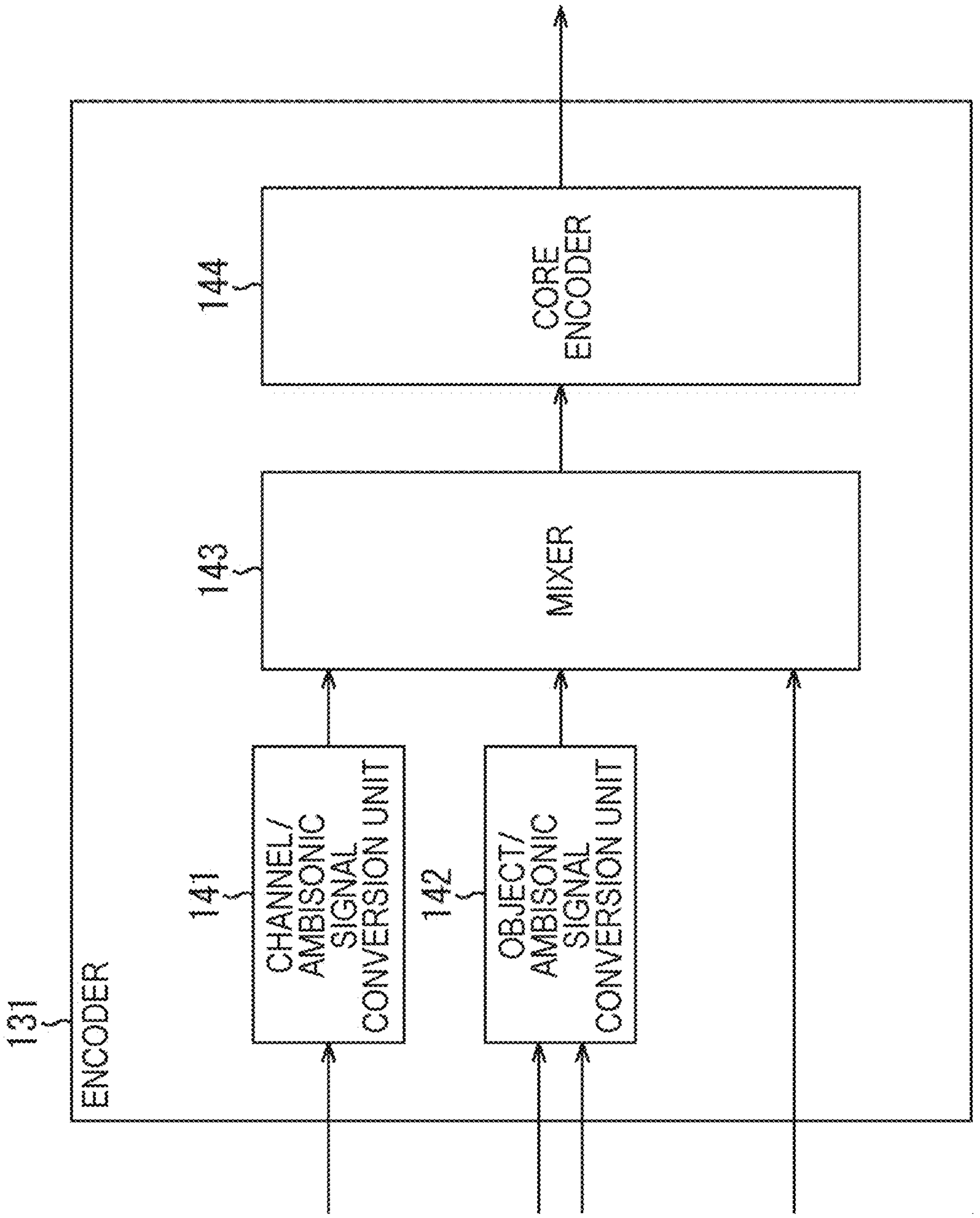
FIG. 16 is a diagram illustrating an exemplary configuration of an encoder.

In a case where all the signals are made in the ambisonic form in this way, an encoder according to the present technology is configured as illustrated in FIG. 16, for example.

An encoder 131 illustrated in FIG. 16 includes a channel/ambisonic signal conversion unit 141, an object/ambisonic signal conversion unit 142, a mixer 143, and a core encoder 144.

The channel/ambisonic signal conversion unit 141 converts a supplied input channel signal of each audio channel to an ambisonic output signal, and supplies it to the mixer 143.

For example, the channel/ambisonic signal conversion unit 141 is provided with components similar to those of the ambisonic gain calculation unit 21 to the ambisonic matrix application unit 23 illustrated in FIG. 6. The channel/ambisonic signal conversion unit 141 performs processing similar to that in the signal processing apparatus 11, thereby converting an input channel signal to an ambisonic output signal in the ambisonic form.

Further, the object/ambisonic signal conversion unit 142 includes the ambisonic gain calculation unit 21, the ambisonic rotation unit 22, and the ambisonic matrix application unit 23 illustrated in FIG. 6.

The object/ambisonic signal conversion unit 142 finds an ambisonic output signal of each ambisonic channel on the basis of the supplied metadata of the audio objet and the input audio object signal, and supplies it to the mixer 143.

That is, the object/ambisonic signal conversion unit 142 converts the input audio objet signal into the ambisonic output signal in the ambisonic form on the basis of the metadata.

As described above, when the input audio object signal is converted to the ambisonic output signal, the input audio object signal can be directly converted to the ambisonic output signal without generating 19 spread audio objects. Thereby, the calculation amount can be remarkably reduced.

The mixer 143 mixes the supplied input ambisonic signal, the ambisonic output signal supplied from the channel/ambisonic signal conversion unit 141, and the ambisonic output signal supplied from the object/ambisonic signal conversion unit 142.

That is, the signals of the same ambisonic channel including the input ambisonic signal and the ambisonic output signal are added in the mixing. The mixer 143 supplies the ambisonic signal obtained by the mixing to the core encoder 144.

The core encoder 144 encodes the ambisonic signal supplied from the mixer 143, and outputs the resultant output bit stream.

An input channel signal or an input audio object signal is converted into a signal in the ambisonic form by use of the present technology also in a case where the pre-rendering processing is performed in the encoder 131 in this way, thereby reducing the calculation amount.

As described above, according to the present technology, an ambisonic gain can be directly obtained and converted to an ambisonic signal without generating spread audio objects depending on spread information included in metadata of an audio object, thereby remarkably reducing the calculation amount. In particular, the present technology is highly advantageous in decoding a bit stream including an audio object signal and an ambisonic signal or in converting an audio object signal to an ambisonic signal during the pre-rendering processing in an encoder.

<Exemplary Configuration of Computer>

Incidentally, a series of pieces of processing described above can be performed in hardware or in software. In a case where the pieces of processing are performed in software, a program configuring the software is installed in a computer. Here, the computer includes a computer incorporated in dedicated hardware, a general-purpose personal computer capable of performing various functions by installing various programs therein, and the like, for example.

Figure 17:
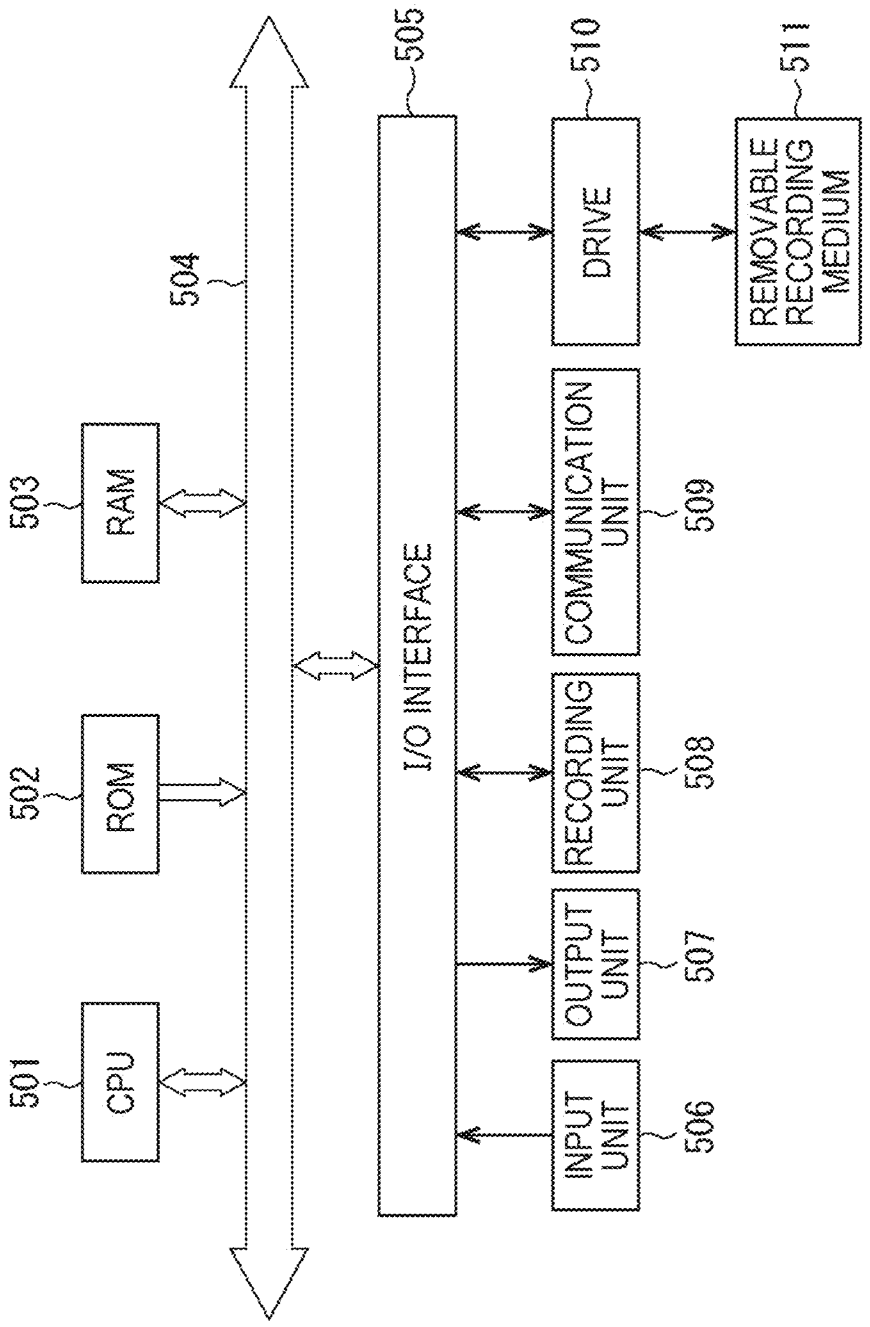
FIG. 17 is a diagram illustrating an exemplary configuration of a computer.

FIG. 17 is a block diagram illustrating an exemplary hardware configuration of a computer performing the above-described pieces of processing by programs.

A central processing unit (CPU) 501, a read only memory (ROM) 502, and a random access memory (RAM) 503 are mutually connected via a bus 504 in a computer.

The bus 504 is further connected with an I/O interface 505. The I/O interface 505 is connected with an input unit 506, an output unit 507, a recording unit 508, a communication unit 509, and a drive 510.

The input unit 506 includes a keyboard, a mouse, a microphone, a imaging device, or the like. The output unit 507 includes a display, a speaker, or the like. The recording unit 508 includes a hard disc, a nonvolatile memory, or the like. The communication unit 509 includes a network interface or the like. The drive 510 drives a removable recording medium 511 such as a magnetic disc, optical disc, magnetooptical disc, or semiconductor memory.

In the thus-configured computer, the programs recorded in the recording unit 508 are loaded and executed in the RAM 503 via the I/O interface 505 and the bus 504, for example, so that the CPU 501 performs the processing described above.

The programs executed by the computer (the CPU 501) can be recoded and provided in the removable recording medium 511 as a package medium, for example. Further, the programs can be provided via a wired or wireless transmission medium such as a local area network, Internet, or digital satellite broadcasting.

The removable recording medium 511 is mounted on the drive 510 in the computer so that the programs can be installed in the recording unit 508 via the I/O interface 505. Further, the programs can be received in the communication unit 509 and installed in the recording unit 508 via a wired or wireless transmission medium. Additionally, the programs can be previously installed in the ROM 502 or the recording unit 508.

Additionally, the programs executed by the computer may be programs by which the pieces of processing are performed in time series in the order described in the present specification, or may be programs by which the pieces of processing are performed in parallel or at necessary timings such as on calling.

Further, embodiments of the present technology are not limited to the above-described embodiments, and various modifications can be made without departing from the spirit of the present technology.

For example, the present technology can take a Cloud computing configuration in which a function is distributed and cooperatively processed in a plurality of apparatuses via a network.

Further, each step described in the above flowchart can be performed in one apparatus, and additionally may be distributed and performed in a plurality of apparatuses.

Further, in a case where one step includes a plurality of pieces of processing, the plurality of pieces of processing included in one step can be performed in one apparatus or may be distributed and performed in a plurality of apparatuses.

Further, the present technology can take the following configurations.

(1) A signal processing apparatus including:

an ambisonic gain calculation unit configured to find, on the basis of object position information and spread information of an object, an ambisonic gain while the object is present at a position indicated by the object position information.

(2) The signal processing apparatus according to (1), further including:

an ambisonic signal generation unit configured to generate an ambisonic signal of the object on the basis of an audio object signal of the object and the ambisonic gain.

(3) The signal processing apparatus according to (1) or (2), in which the ambisonic gain calculation unit finds a reference position ambisonic gain, on the basis of the spread information, assuming that the object is present at a reference position, and performs rotation processing on the reference position ambisonic gain to find the ambisonic gain on the basis of the object position information.

(4) The signal processing apparatus according to (3), in which the ambisonic gain calculation unit finds the reference position ambisonic gain on the basis of the spread information and a gain table.

(5) The signal processing apparatus according to (4), in which, in the gain table, a spread angle is associated with the reference position ambisonic gain.

(6) The signal processing apparatus according to (5), in which the ambisonic gain calculation unit performs interpolation processing on the basis of each reference position ambisonic gains associated with each of a plurality of the spread angles in the gain table to find the reference position ambisonic gain corresponding to a spread angle indicated by the spread information.

(7) The signal processing apparatus according to any one of (3) to (6), in which the reference position ambisonic gain is a sum of respective values obtained by substituting respective angles indicating a plurality of respective spatial positions defined for spread angles indicated by the spread information into a spherical harmonic function.

(8) A signal processing method including:

finding, on the basis of object position information and spread information of an object, an ambisonic gain while the object is present at a position indicated by the object position information.

(9) A program for causing a computer to perform processing including:

finding, on the basis of object position information and spread information of an object, an ambisonic gain while the object is present at a position indicated by the object position information.

REFERENCE SIGNS LIST

11 Signal processing apparatus
21 Ambisonic gain calculation unit

22 Ambisonic rotation unit
23 Ambisonic matrix application unit
25 Ambisonic rendering unit

The invention claimed is:

1. A signal processing apparatus comprising:
processing circuitry configured to:
calculate, on a basis of spread angle information of an object, an ambisonic gain while the object is present at a predetermined position; and
output an output audio signal based at least in part on the calculated ambisonic gain and an input audio signal, wherein the spread angle information indicates a size of the object.

2. The signal processing apparatus according to claim 1, wherein the processing circuitry is configured to:
calculate a reference position ambisonic gain, on the basis of the spread angle information, assuming that the object is present at a reference position, and
perform rotation processing on the reference position ambisonic gain to find the ambisonic gain on a basis of object position information indicating the predetermined position.

3. The signal processing apparatus according to claim 2, wherein the reference position ambisonic gain is a sum of respective values obtained by substituting respective angles indicating a plurality of respective spatial positions defined for spread angles indicated by the spread angle information into a spherical harmonic function.

4. The signal processing apparatus according to claim 2, wherein the processing circuitry is configured to calculate the reference position ambisonic gain on a basis of the spread angle information and a gain table.

5. The signal processing apparatus according to claim 4, wherein, in the gain table, a spread angle is associated with the reference position ambisonic gain.

6. The signal processing apparatus according to claim 5, wherein the processing circuitry is configured to perform interpolation processing on a basis of each reference position ambisonic gain associated with each of a plurality of the spread angles in the gain table to find the reference position ambisonic gain corresponding to a spread angle indicated by the spread angle information.

7. A signal processing method performed by a processor, comprising:
calculating, on a basis of spread angle information of an object, an ambisonic gain while the object is present at a predetermined position; and
outputting an output audio signal based at least in part on the calculated ambisonic gain and an input audio signal, wherein the spread angle information indicates a size of the object.

8. A non-transitory computer readable medium containing instructions that, when executed by a processor, perform a signal processing method comprising:
calculating, on a basis of spread angle information of an object, an ambisonic gain while the object is present at a predetermined position; and
outputting an output audio signal based at least in part on the calculated ambisonic gain and an input audio signal, wherein the spread angle information indicates a size of the object.

* * * * *